United States Patent
Kunikiyo et al.

(10) Patent No.: US 6,563,159 B1
(45) Date of Patent: *May 13, 2003

(54) SUBSTRATE OF SEMICONDUCTOR INTEGRATED CIRCUIT

(75) Inventors: Tatsuya Kunikiyo, Tokyo (JP); Ken-ichiro Sonoda, Tokyo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/084,908

(22) Filed: May 27, 1998

(30) Foreign Application Priority Data

Dec. 2, 1997 (JP) .............................................. 9-331848
Feb. 18, 1998 (JP) ............................................ 10-036165

(51) Int. Cl.[7] ........................ H01L 27/108; H01L 29/76; H01L 29/94; H01L 31/119
(52) U.S. Cl. ...................... 257/297; 257/345; 257/372; 257/375; 257/376; 257/392; 257/394; 257/547
(58) Field of Search .................... 257/297, 345–372, 257/375–376, 392, 394–500, 547–550, 511, 525, 526; 438/401, 359, 425

(56) References Cited

U.S. PATENT DOCUMENTS

| | | | | |
|---|---|---|---|---|
| 3,812,518 A | * | 5/1974 | Kurz et al. | 257/465 |
| 4,881,112 A | * | 11/1989 | Matsushita | 257/338 |
| 4,970,568 A | * | 11/1990 | Hiraguchi et al. | 257/372 |
| 5,047,818 A | * | 9/1991 | Tsukamoto | 257/297 |
| 5,095,355 A | | 3/1992 | Shiomi et al. | |
| 5,310,691 A | | 5/1994 | Suda | |
| 5,324,982 A | * | 6/1994 | Nakazato et al. | 257/546 |
| 5,497,017 A | * | 3/1996 | Gonzales | 257/306 |
| 5,830,799 A | * | 11/1998 | Ammo et al. | 438/401 |

FOREIGN PATENT DOCUMENTS

| | | |
|---|---|---|
| EP | 0 018 764 | 11/1980 |
| EP | 0 566 186 | 10/1993 |
| JP | 63-246861 | 10/1988 |
| JP | 8-279598 | 10/1996 |
| JP | 9-8144 | 1/1997 |
| JP | 9-199703 | 7/1997 |

OTHER PUBLICATIONS

Hsieh, et al. "A Field–Funneling Effect on the Collection of Alpha–Particle–Generated Carriers in Silicon Devices", IEEE Electron Device Letters, vol. EDL–2, No. 24, (Apr. 1981, pp. 103–105.

Narita, et al. "A Novel On–Chip Electrostatic Discharge (ESD) Protection for beyond 500MHz DRAM", IEEE, 1995.

* cited by examiner

Primary Examiner—Phat X. Cao
Assistant Examiner—Theresa T. Doan
(74) Attorney, Agent, or Firm—Oblon, Spivak, McClelland, Maier & Neustadt, R.C.

(57) ABSTRACT

Provided is a substrate of a semiconductor integrated circuit which can easily manufacture an integrated circuit having a soft error resistance, a latch up resistance and an ESD resistance increased. A thickness of a semiconductor surface layer having a lower impurity concentration than that of each of substrate single crystals 51 and 55 is varied according to a resistance which should be possessed by each section such as a memory cell section 5, a logic section 6, an input-output section 8 or the like for a region where each section is to be formed.

12 Claims, 37 Drawing Sheets

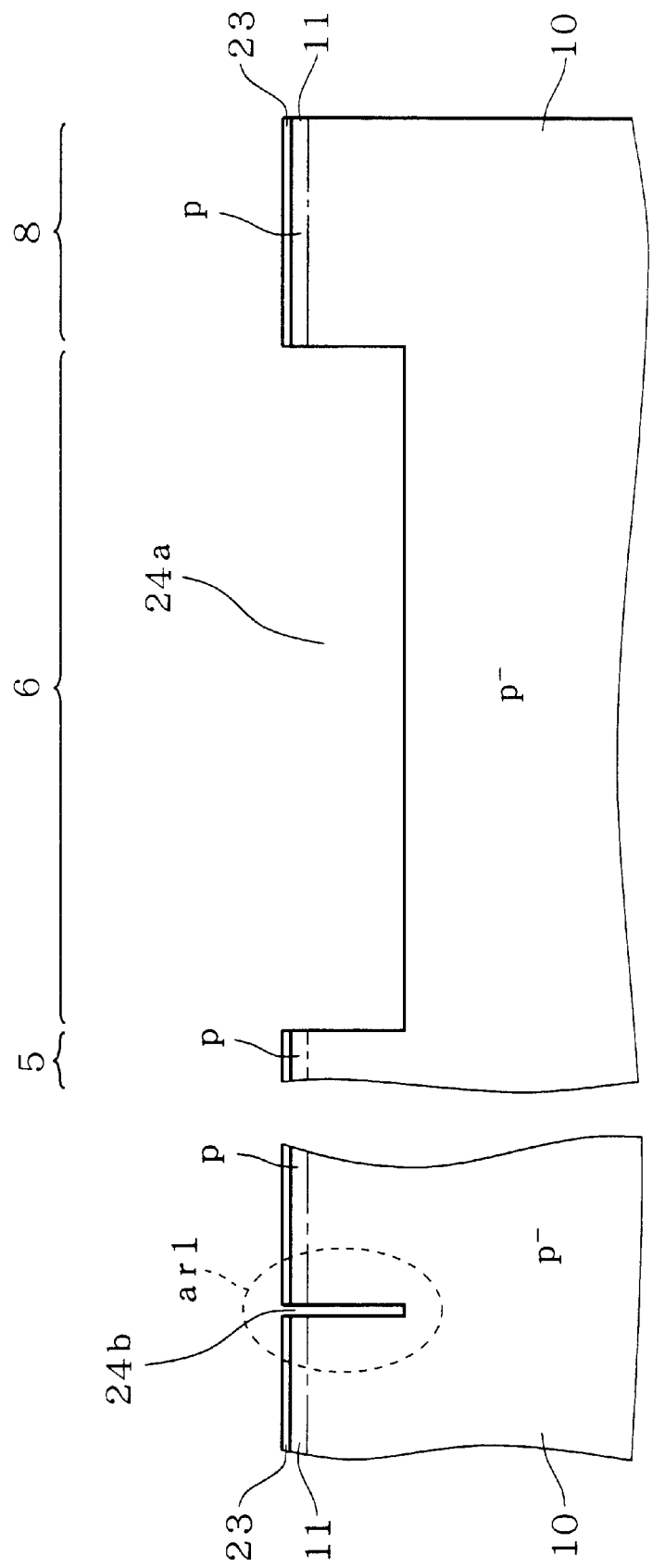

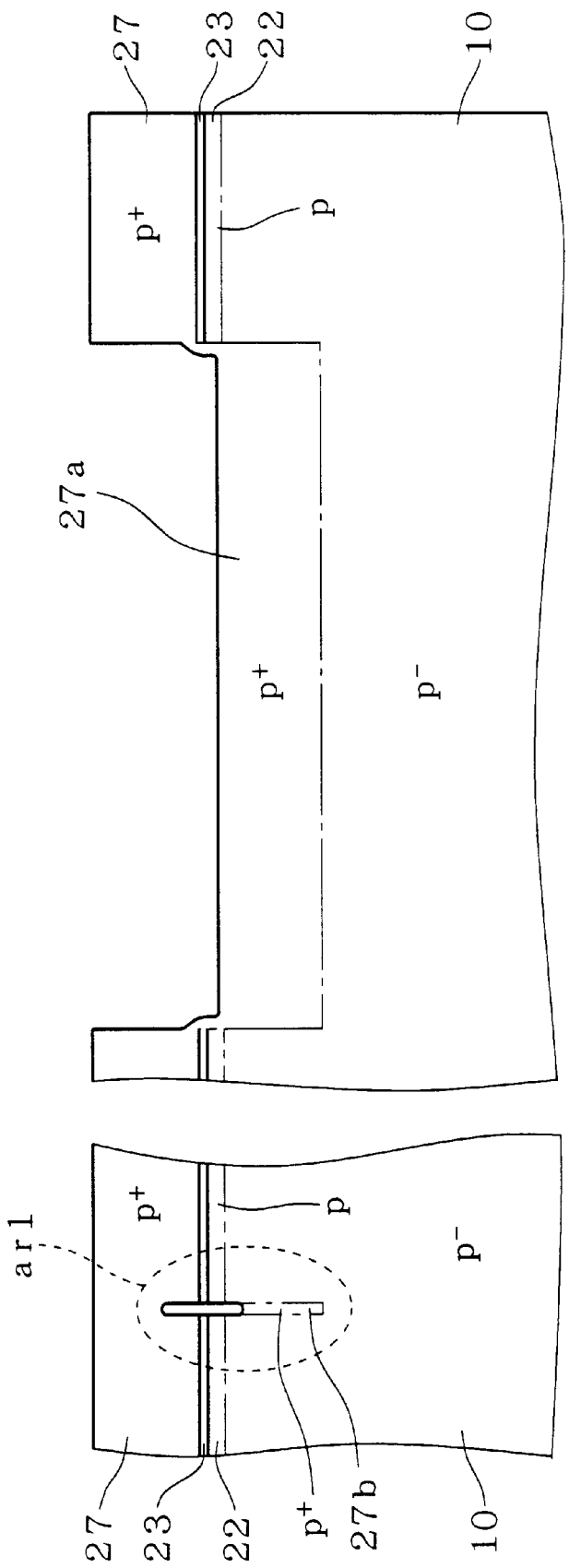

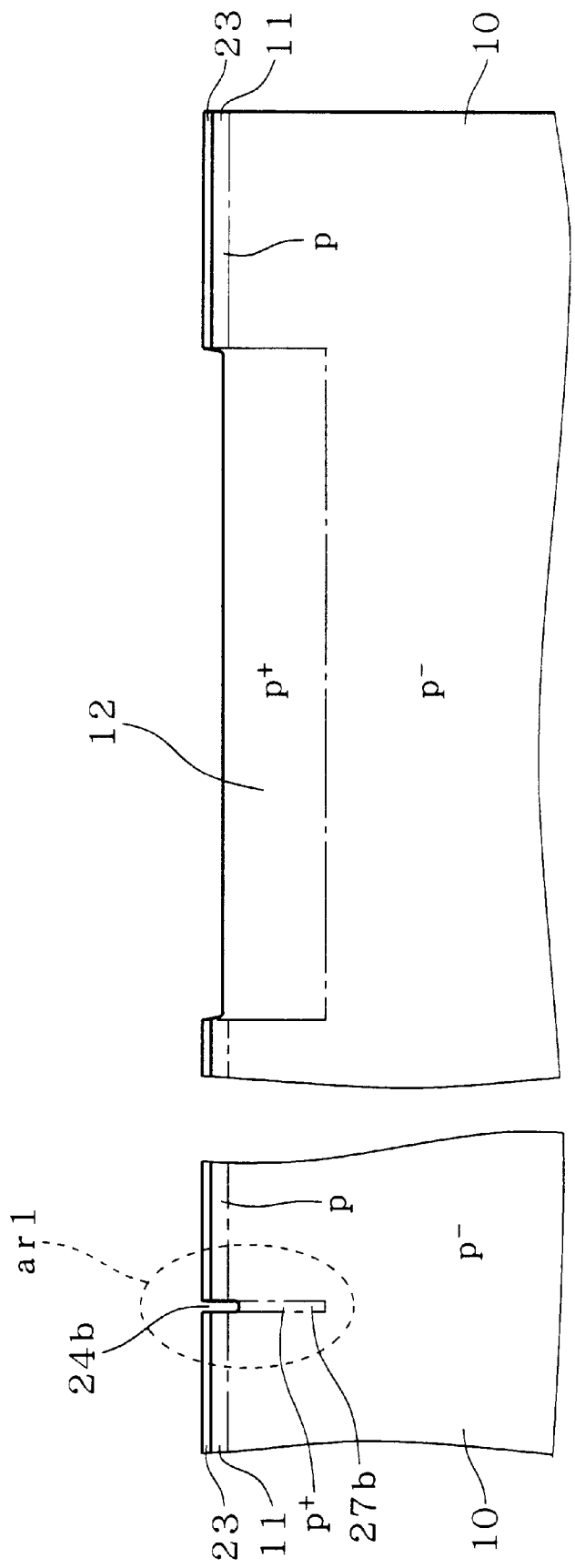

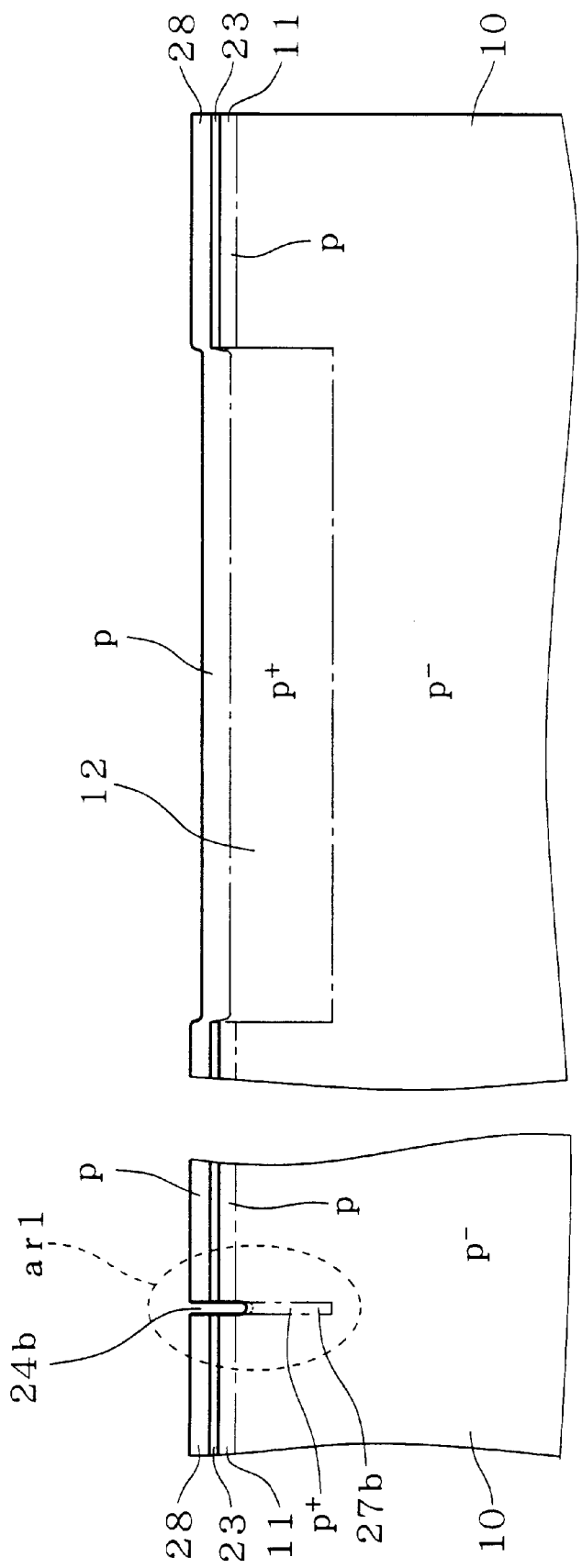

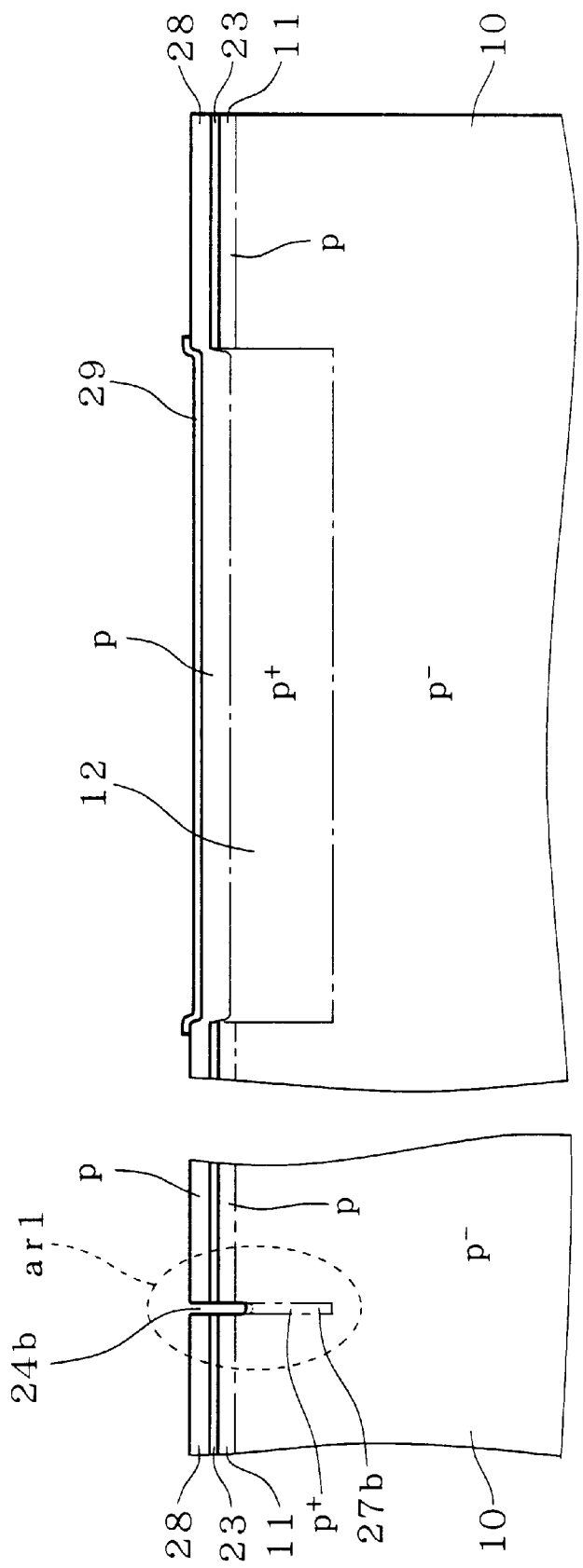

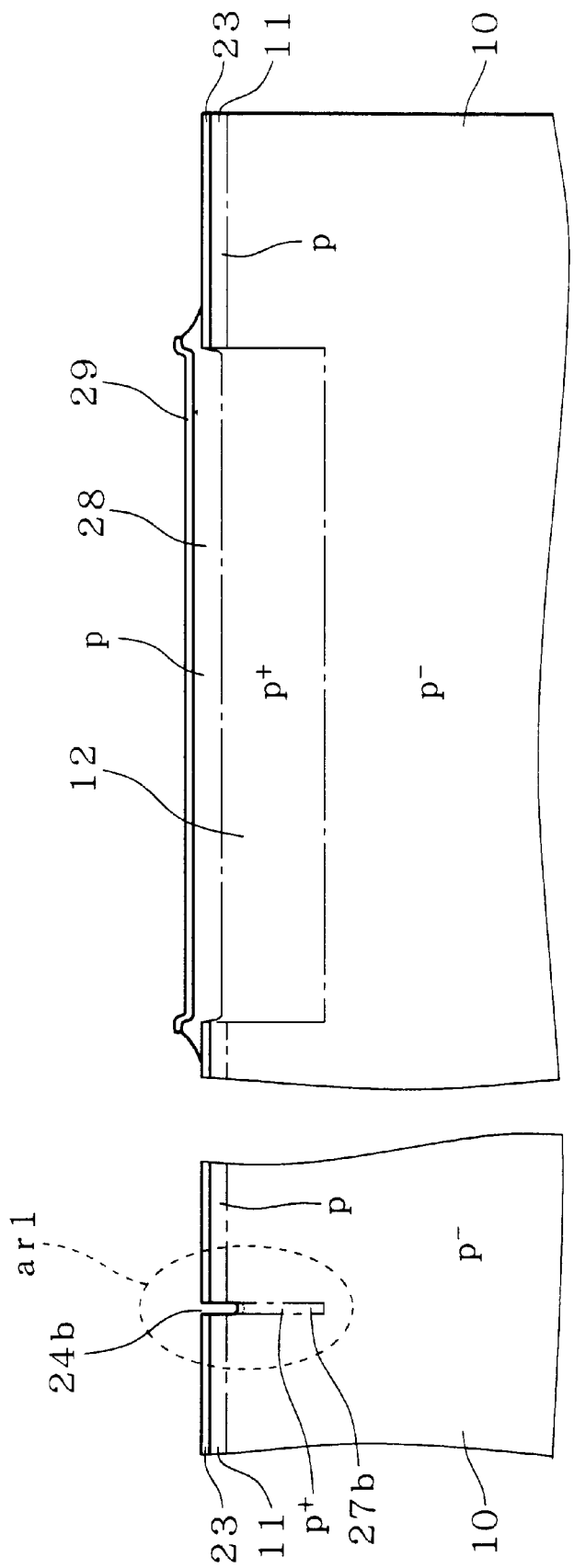

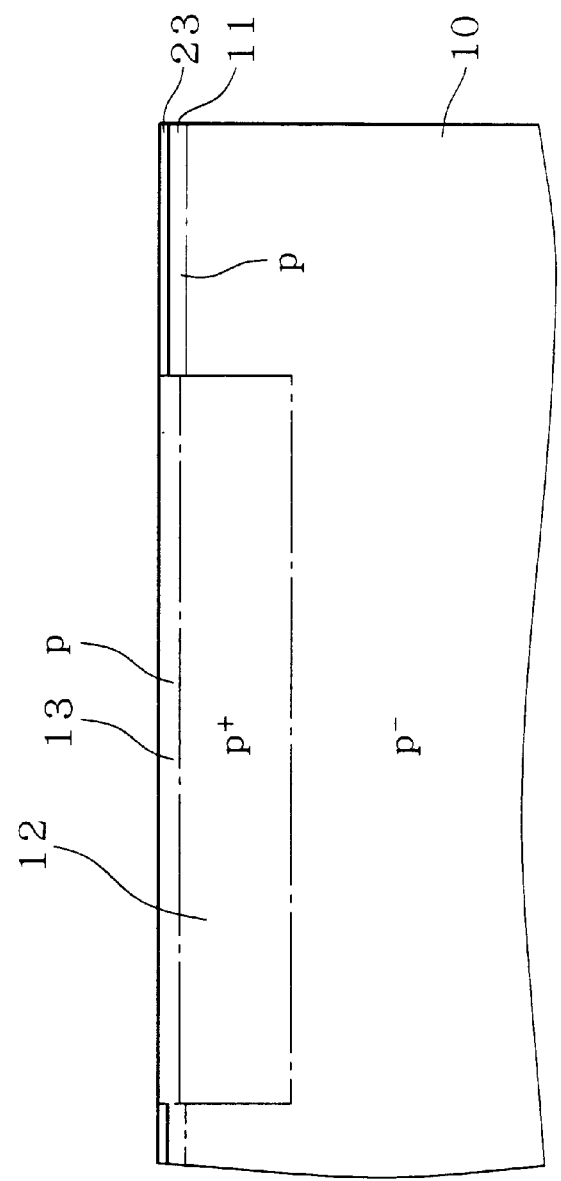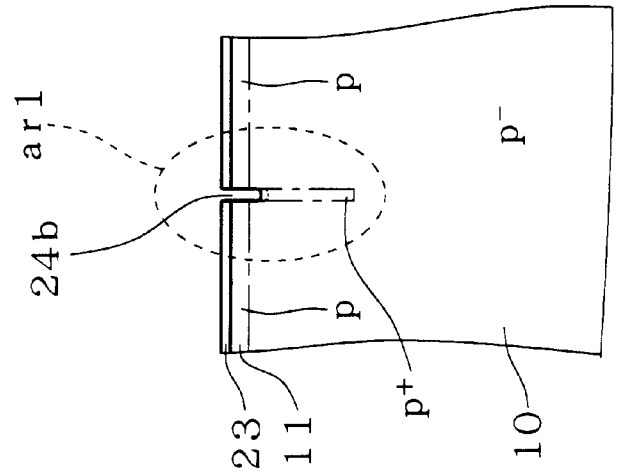

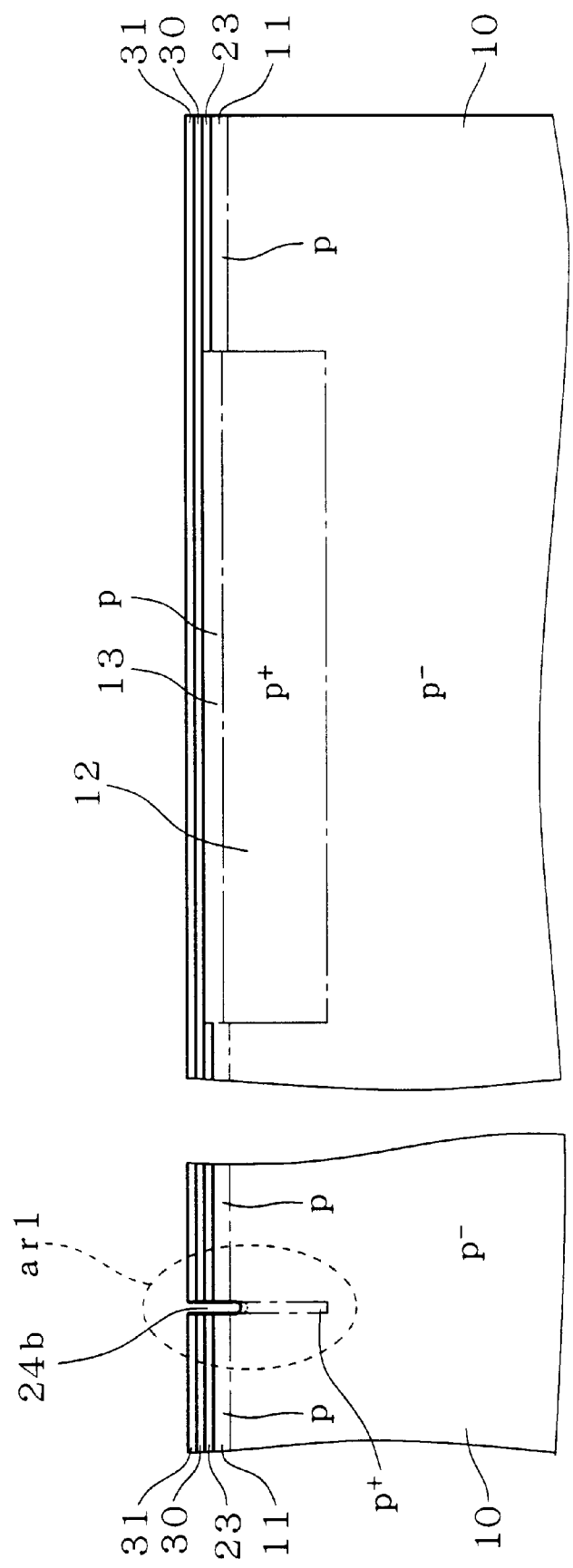

F I G. 14
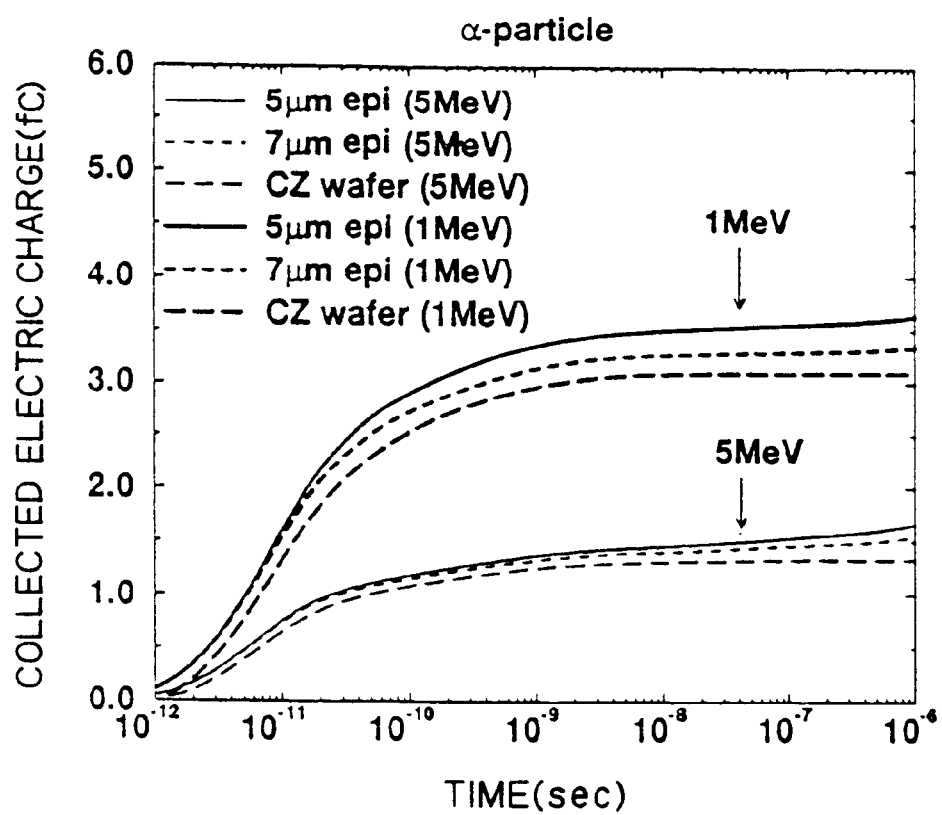

SUBSTRATE OF SEMICONDUCTOR INTEGRATED CIRCUIT

BACKGROUND OF THE INVENTION

1. Field of the Invention

The present invention relates to a substrate of a semiconductor integrated circuit, and more particularly to a substrate on which a semiconductor integrated circuit is to be formed, the semiconductor integrated circuit comprising a plurality of circuit sections, each of the circuit sections having a different kind of resistance to which great importance is attached because of different functions of the circuit sections, for example, a circuit section formed by using a plurality of transistors, a circuit section having a lot of storage capacitors of a DRAM formed thereon, and the like.

2. Description of the Background Art

FIG. 45 is a plan view showing a relationship between a wafer and a substrate of a semiconductor integrated circuit. Independent semiconductor integrated circuits are formed on a plurality of regions 2 in a wafer 1, respectively. Examples of the semiconductor integrated circuit include a semiconductor memory. By taking the semiconductor memory as an example, the prior art related to the substrate of the semiconductor integrated circuit will be described below.

Conventionally, soft error, latch up and electro-static discharge (hereinafter referred to as ESD) have mainly been known as the causes of a malfunction of a memory cell forming the semiconductor memory. In this order, phenomena will briefly be described below. The prior art which has been carried out as countermeasures will be described below.

The soft error means a temporary malfunction which is randomly generated in an integrated circuit due to a passage of α-rays through the integrated circuit and can be recovered. The α-rays are emitted from uranium (U) and thorium (Th) contained in a small quantity in a package housing the integrated circuit, an aluminum wiring to be used for manufacturing the integrated circuit, a silicide electrode, and the like. α-particles are charged to positive bivalence by an atomic nucleus of helium ($He^{++}$). When the α-particle passes through the integrated circuit, an electron-hole pair having a concentration of $10^{17}$ to $10^{20} cm^3$ is generated. The generated electrons or holes to act as minority carriers flow into a p-type diffusion layer or an n-type diffusion layer to change electric charges stored in the diffusion layer. For this reason, the temporary malfunction, that is, the soft error is caused.

Whether the soft error is actually caused or not greatly depends on how the minority carriers of the generated electron-hole pairs are collected into the diffusion layer in addition to the generation of the electron-hole pairs. As the process of causing the soft error, the following three mechanism are given. Small pieces of a semiconductor on which individual integrated circuits are formed will be hereinafter referred to as substrates.

(1) Drift of the minority carriers in a depletion layer.
(2) Diffusion of the minority carriers on a neutral region in the substrate.
(3) A funneling effect in which an electric field generated by flow of majority carriers accelerates collection of the minority carriers into the diffusion layer.

(1) indicates a mechanism in which the minority carriers generated by α-rays incident on the depletion layer are collected into the diffusion layer by an electric field for drift which is applied to the depletion layer. A time taken for carrier collection is approximately an order of $10^{-11}$ second. On the other hand, there is the Auger process as a carrier recombination process in a silicon substrate which is doped at a high concentration. A lifetime of the minority carrier depends on an impurity concentration of the diffusion layer. The lifetime of the electron ranges from $3\times10^{-5}$ second (hole concentration: $10^{16}/cm^3$) to $1\times10^{-9}$ second (hole concentration: $10^{20}/cm^3$). The lifetime of the hole ranges from $1\times10^{-5}$ second (electron concentration: $10^{16}/cm^3$) to $4\times10^{-10}$ second (electron concentration: $10^{20}/cm^3$). A time taken for the carrier collection performed by the electric field for drift is approximately an order of $10^{-11}$ second. Therefore, it is apparent that the carrier collection is seldom affected by recombination.

(2) indicates a mechanism in which the minority carriers in the neutral region are collected into the diffusion layer by diffusion. A diffusion coefficient Dn of the electron is 10 to 30 $cm^2/sec$. A lifetime τ n of the electron ranges $3\times10^{-5}$ to $1\times10^{-9}$ second. An average diffusion length 1 d of the electron is given by a square root of a product of the diffusion coefficient Dn and lifetime τ n of the electron.

The average diffusion length 1 d thus obtained ranges from 1 μm (hole concentration: $10^{20}/cm^3$) to 300 μm (hole concentration: $10^{16}/cm^3$). An energy of α-particles emitted from uranium and thorium often ranges from 4 MeV to 5 MeV. A range of the α-particles having an injection energy of 5 MeV is about 23 μm. Accordingly, if a boron concentration of a p-type substrate is $10^{16}/cm^3$, the electrons generated by the α-particles are collected into the diffusion layer by diffusion. If the boron concentration of the p-type substrate is $10^{20}/cm^3$, most of the electrons generated by the α-particles in a portion which is deeper than the diffusion layer by 1 μm or more are recombined and are not collected by the diffusions.

Next, description will be given to the mechanism (3) wherein the minority carriers are collected into the diffusion layer by the funneling effect in which the electric field generated by the flow of the majority carriers accelerates the collection of the minority carriers into the diffusion layer. If the electron-hole pairs generated by the α-particles are separated by the electric field applied into the depletion layer, a dipole electric field is generated by the separated electrons and holes. The dipole electric field weakens the electric field which has been applied into the depletion layer. Therefore, a part of the depletion layer deeply enters the substrate so that a voltage drop is caused. Due to the electric field deeply entering the substrate, the minority carriers generated in the substrate by the α-particles are collected into the diffusion layer formed on a surface of the substrate.

Various well structures have conventionally been proposed in order to prevent the soft error from being caused by the α-particles. A high concentration impurity layer acting as a barrier to the minority carriers has been formed in such a manner that the minority carriers generated in the substrate do not reach the integrated circuit formed in the vicinity of the surface of the substrate of the semiconductor integrated circuit. The high concentration impurity layer has been formed by performing heat treatment after ions are implanted at a high energy. According to this method, a thickness of the impurity layer is insufficient. Therefore, epitaxial wafers such as a p on $p^-$ wafer, a p on $p^+$ wafer, a p on $p^{++}$ wafer and the like have recently been used as substrate materials. Each of the substrates formed on the epitaxial wafers (which will be hereinafter referred to as a p on p⁻ substrate, a p on p⁺ substrate and a p on p⁺⁺ substrate, respectively) includes a semiconductor surface layer which is subjected to epitaxial growth on a substrate single crystal of the semiconductor cut out of an ingot, and the semiconductor substrates have impurity concentrations of p⁻, p⁺ and p⁺⁺. A structure of a substrate of a semiconductor integrated circuit formed by using these wafers will be described below with reference to FIG. 39.

FIG. 39 is a typical diagram showing a sectional structure of the p on p⁻ substrate, the p on p⁺ substrate or the p on p⁺⁺ substrate according to the prior art. An epitaxial layer 101 which is a p-type semiconductor surface layer is formed on a substrate single crystal 102 which is a p-type semiconductor substrate layer. In this specification, the semiconductor surface layer is a layer made of a single crystal having a single orientation which is provided on a surface of a semiconductor substrate and on which an integrated circuit is formed. The semiconductor substrate layer is made of a single crystal which serves to become a direct growth origin of the semiconductor surface layer and to determine the orientation of the semiconductor surface layer. The semiconductor surface layer is a layer having an almost uniform impurity concentration such as an epitaxial layer or a substrate single crystal of a wafer, and is different from a layer (a well or the like) to which an impurity is added after a crystal is formed by diffusion or the like.

The p on p⁻ substrate, the p on p⁺ substrate and the p on p⁺⁺ substrate are different from one another in that the p-type substrate single crystal has different impurity concentrations. The following division of the impurity concentration is convenient but is not general, and is defined on the basis of a relationship with the effects of the present invention. The impurity concentration of each substrate single crystal is equal to or greater than $10^{15}/cm^3$ and is smaller than $10^{18}/cm^3$ on the p⁻ layer, is equal to or greater than $10^{18}/cm^3$ and is smaller than $10^{20}/cm^3$ on the p⁺ layer, and is equal to or greater than $_{10}{}^{20}/cm^3$ on the p⁺⁺ layer.

By using these substrate structures, a layer acting as a barrier to the electrons is provided in a lower portion of the semiconductor substrate layer, that is, a lower portion of the epitaxial layer. Therefore, it is expected that a soft error resistance is increased. However, the soft error resistance is not actually increased. The reason is that electric charges collected into the diffusion layer are almost equal to electric charges collected by funneling. This means that the minority carriers generated by the α-particles are collected into the diffusion layer by the funneling for a shorter time than a time for which they decay by the Auger recombination in the high concentration impurity layer. Accordingly, even if the p on p⁺ substrate and the p on p⁺⁺ substrate are used, effects of the decay of the generated minority carriers caused by the Auger recombination cannot be expected. For this reason, it is impossible to decrease the electric charges collected into the diffusion layer.

If a thickness of the semiconductor surface layer is equal, fewer electric charges are collected into the diffusion layer of the substrate surface on the p on p⁻ substrate where the minority carriers easily escape to a back side than the p on p⁺ substrate. This means that the p⁺ layer provided under the semiconductor surface layer acts as the barrier both in a direction of the substrate surface and that of the back side in respect of the minority carriers. The electrons easily escape to the back side because a potential barrier layer is lower on the p⁻ layer than the p⁺ layer. Therefore, the p on p⁻ wafer has a greater soft error resistance than the p on p⁺ wafer. From the above-mentioned consideration, it is apparent that the p on p⁻ substrate is effective in the soft error if a difference in a defect density is ignored.

Next, the latch up which is the second cause of the malfunction of the semiconductor memory cell will be described. The latch up means a malfunction of a CMOS device which is caused by operation of a thyristor that can be fabricated by parasitism when the CMOS device is formed on a surface of a substrate.

With reference to FIG. 40, a mechanism of the latch up will be described below. FIG. 40 is a typical diagram showing an example of a sectional structure of a CMOS transistor. In the CMOS transistor shown in FIG. 40, an n well 104 is provided on a p-type substrate 103 to isolate adjacent transistors having different conductivity types from each other. It is apparent that such a CMOS transistor includes a lateral type npn parasitic bipolar transistor Q1 and a vertical type pnp parasitic bipolar transistor Q2. FIG. 41 shows an equivalent circuit of a parasitic circuit formed with this structure. $R_{P1}$ and $R_{P2}$ represent resistances generated on the p-type substrate 103, and $R_{N1}$ and $R_{N2}$ represent resistances generated on the n well 104. The parasitic circuit formed by the two parasitic bipolar transistors Q1 and Q2 and the resistances $R_{P1}$, $R_{P2}$, $R_{N1}$ and $R_{N2}$ causes the latch up. As the cause of the latch up, overshoot and undershoot of voltages $V_{IN}$ and $V_{OUT}$ on an input terminal 105 and an output terminal 106, internal punch through and avalanche multiplication, a leak current of a parasitic MOS transistor and the like are given. The overshoot and undershoot of the voltages $V_{IN}$ and $V_{OUT}$ on the input terminal 105 and the output terminal 106 will be described below.

With reference to FIG. 42, description will be given to operation of the CMOS transistor which is performed when the voltage of the output terminal 106 is overshot. Usually, a supply voltage $V_{DD}$ is applied from a power terminal 108 to the n well 104, and a ground voltage $V_{SS}$ is applied from a ground terminal 107 to the p-type substrate 103. If the voltage $V_{OUT}$ of the output terminal 106 is raised to the supply voltage $V_{DD}$ or more (overshoot) due to some cause in this state, a pn junction of a p⁺ region connected to the output terminal 106 and the n well 104 is forward biased. Consequently, a large number of holes are injected into the p⁺ region toward the n well 104. The pn junction formed by the n well 104 and the p-type substrate 103 is reversely biased. Therefore, the holes are collected into the PN junction and flow into the p-type substrate 103, thereby being changed into a majority carrier current. Since the majority carrier current flows into the ground terminal 107 provided on the surface or back side of the p-type substrate 103, it causes an ohmic voltage drop in the p-type substrate 103. As a result, an emitter-base of a lateral type parasitic bipolar transistor comprising an n⁺ region connected to the ground terminal 107, the p-type substrate 103 and the n well 104 is forward biased so that the lateral type transistor is conducted. An electronic current flowing in the lateral type transistor is changed into a majority carrier in the n well 104 to cause the ohmic voltage drop. Consequently, a base-emitter of a vertical type bipolar transistor is forward biased increasingly. If positive feedback is fully increased, the latch up is caused so that a great current flows from the output terminal 106 toward the ground terminal 107.

If the voltage of the output terminal 106 is undershot, the equivalent circuit is changed as shown in FIG. 43. A basic mechanism is the same as in the case of the above-mentioned overshoot except that carriers to be injected into bases of the two parasitic bipolar transistors Q1 and Q2 are electrons.

In brief, collector currents of the two parasitic bipolar transistors Q1 and Q2 in the CMOS device flow in the resistances $R_{N1}$ and $R_{P1}$ provided between mutual emitters and bases respectively so that the emitters and the bases are forward biased, thereby causing the latch up.

As is apparent from the above-mentioned consideration, a reduction in an ohmic voltage drop in the p-type substrate 103 or in the n well 104 is effective in prevention of the latch up. It is found that a deep portion of the p-type substrate 103 is formed by a $p^+$ layer and a $p^{++}$ layer, that is, the p on $p^+$ substrate and the p on $p^{++}$ substrate have structures which are effective in the latch up.

Next, the ESD (Electro-Static Discharge) which is the third cause of the malfunction of the semiconductor memory cell will be described with reference to FIG. 44. In some cases, a $p^-$ semiconductor surface layer 111 is formed on a p-type substrate 110 having a high impurity concentration and an element 112 is formed on the semiconductor surface layer 111 in order to prevent undershoot of a voltage on an input terminal. An external circuit 113 connected to the semiconductor substrate 110 shown in FIG. 44 is an equivalent circuit of a human body with the human body coming in contact with an input-output terminal 114 of a chip. According to a simulation, in the case where the epitaxial substrate 110 using an epitaxial wafer is utilized, an ESD resistance is reduced more than in a substrate using a wafer manufactured by the Czochralski method (which will be hereinafter referred to as a CZ substrate). A reduction in the ESD resistance is caused by the following fact. A substrate resistance $R_{sub}$ of the epitaxial substrate 110 is lower than in the CZ substrate. Therefore, the parasitic bipolar transistor (npn lateral type) operates with difficulty and a voltage of an electrode is held at a higher value. The voltage of the electrode is held high so that an electric field in the element is increased and a lattice temperature is raised. When the lattice temperature is higher than a melting point of the semiconductor substrate 110, the element is molten and broken. Accordingly, it is apparent that the p on $p^-$ substrate is better than the p on $p^+$ substrate from the viewpoint of the ESD resistance.

The three causes of the malfunction of the integrated circuit, that is, the soft error, the latch up and the ESD have been described above. Table 1 shows a substrate structure which is effective in prevention of respective phenomena.

TABLE 1

|  | p on $p^-$ wafer | p on $p^+$ wafer |
| --- | --- | --- |
| Soft-Error Resistance | O | X |
| Latch-Up Resistance | X | O |
| ESD Resistance | O | X |

It is desirable that a single substrate structure should be effective in the prevention of all the above-mentioned phenomena. It is apparent from Table 1 that any substrate structure cannot simultaneously prevent all the phenomena of the soft error, the latch up and the ESD.

Recently, an epitaxial wafer having an epitaxial layer for forming the p on $p^+$ substrate, the p on $p^-$ substrate and the like has been used for mass production of an integrated circuit rather than the CZ substrate for two other reasons in addition to the fact that the epitaxial wafer serves to suppress the above-mentioned three malfunctions. The first reason is that a breakdown voltage of a thermal oxide film is high because the epitaxial wafer has a smaller micro defect density of crystal originated-particles (hereinafter referred to as COP), flow pattern defects (hereinafter referred to as FPD) or the like which highly correlate with the breakdown voltage of the thermal oxide film as compared with the CZ wafer. It has been found that the breakdown voltage of the thermal oxide film checked by way of a non-defective rate is increased if the density of the COP or the FPD is reduced. The second reason is as follows. While the use of a wafer having a bore of 300 mm is indispensable to an increase in payability in mass-produced integrated circuits, it is hard to fabricate a CZ wafer having a bore of 300 mm and a smaller defect density of the COP or the FPD. In addition, a cost is increased more than in the epitaxial wafer. In other words, it can be concluded that the epitaxial wafer is more excellent than the CZ wafer with a great bore of 300 mm or more in respect of the quality and cost.

As described above, in the semiconductor memory device manufactured by using a substrate of a semiconductor integrated circuit and an integrated circuit on which a memory and a logic are mounted together according to the prior art, the circuit portions which attach great importance to resistances to different phenomena, for example, the memory cell section, the logic section, the input-output section and the like are formed on a single substrate. Therefore, there has been a problem that it is not easy to simultaneously obtain desirable resistances to all the different phenomena such as the soft error, the latch up, the ESD and the like even if any of the p on $p^-$ structure, the p on $p^+$ structure and the p on $p^{++}$ structure is employed as a structure of the substrate of the semiconductor integrated circuit.

SUMMARY OF THE INVENTION

A first aspect of the present invention is directed to a substrate of a semiconductor integrated circuit comprising a first semiconductor substrate layer made of a substrate single crystal having a single orientation and having a first impurity concentration almost uniformly thereover, a second semiconductor substrate layer formed on the first semiconductor substrate layer and made of a single crystal having the same orientation as that of the first semiconductor substrate layer, having a second impurity concentration, and having the same conductivity type as that of the first semiconductor substrate layer, a first semiconductor surface layer directly formed on the first semiconductor substrate layer and made of a single crystal having the same orientation as that of the first semiconductor substrate layer, having a third impurity concentration almost uniformly thereover and having the same conductivity type as that of the first semiconductor substrate layer for forming a first circuit section including a plurality of semiconductor elements, and a second semiconductor surface layer directly formed on the second semiconductor substrate layer and made of a single crystal having the same orientation as that of the second semiconductor substrate layer, having a fourth impurity concentration almost uniformly thereover and having the same conductivity type as that of the second semiconductor substrate layer for forming a second circuit section including a plurality of semiconductor elements and having a function which is different from that of the first circuit section, wherein the first impurity concentration is different from the second impurity concentration.

A second aspect of the present invention is directed to the substrate of a semiconductor integrated circuit according to the first aspect of the present invention, wherein the first semiconductor surface layer is an epitaxial layer of an epitaxial wafer, and the first semiconductor substrate layer is a substrate single crystal of the epitaxial wafer.

A third aspect of the present invention is directed to the substrate of a semiconductor integrated circuit according to the second aspect of the present invention, wherein the second semiconductor substrate layer and the second semiconductor surface layer are formed on a trench provided on the epitaxial wafer, and the second semiconductor substrate layer is an epitaxial layer.

A fourth aspect, of the present invention is directed to a substrate of a semiconductor integrated circuit comprising a first semiconductor surface layer made of a single crystal having a single orientation and having an almost uniform first impurity concentration thereover for forming a first circuit section including a plurality of semiconductor elements, a second semiconductor surface layer made of a single crystal having the same orientation as that of the first semiconductor surface layer, having the same conductivity type as that of the first semiconductor surface layer and having an almost uniform second impurity concentration thereover for forming a second circuit section including a plurality of semiconductor elements and having a function which is different from that of the first circuit section, and a semiconductor substrate layer which is made of a substrate single crystal having the same orientation as that of each of the first and second semiconductor surface layers, having the same conductivity type as that of each of the first and second semiconductor surface layers and further having an almost uniform third impurity concentration thereover to act as a formation substrate of each of the first and second semiconductor surface layers, and which has first and second principal planes whose heights are different from each other, wherein the first semiconductor surface layer is directly formed on the first principal plane, the second semiconductor surface layer is directly formed on the second principal plane, and the third impurity concentration is different from both the first and second impurity concentrations.

A fifth aspect of the present invention is directed to the substrate of a semiconductor integrated circuit according to the fourth aspect of the present invention, wherein the first semiconductor surface layer is an epitaxial layer of an epitaxial wafer, and the first semiconductor substrate layer is a substrate single crystal of the epitaxial wafer.

A sixth aspect of the present invention is directed to the substrate of a semiconductor integrated circuit according to the fifth aspect of the present invention, wherein the second principal plane is a bottom face of a trench dug over the epitaxial layer of the epitaxial wafer.

A seventh aspect of the present invention is directed to the substrate of a semiconductor integrated circuit according to the fifth aspect of the present invention, wherein the second principal plane is a top face of an epitaxial layer which is newly formed on a bottom face of a trench dug over a surface of the epitaxial wafer.

An eighth aspect of the present invention is directed to the substrate of a semiconductor integrated circuit according to any of the first to seventh aspects of the present invention, further comprising an alignment mark for specifying places where the first circuit section and the second circuit section are to be formed.

A ninth aspect of the present invention is directed to the substrate of a semiconductor integrated circuit according to any of the first to eighth aspects of the present invention, wherein a heavy metal is diffused into a region having a predetermined depth from the first or second semiconductor surface layer.

A tenth aspect of the present invention is directed to a substrate of a semiconductor integrated circuit comprising a semiconductor substrate layer made of a single crystal having a single orientation and having a first impurity concentration almost uniformly thereover, and a semiconductor surface layer directly formed on the semiconductor substrate layer and made of a single crystal which has the same conductivity type and orientation as those of the semiconductor substrate layer and has a well, wherein the semiconductor surface layer includes a predetermined partial region interposed between the well and the semiconductor substrate layer, and the predetermined partial region has a second impurity concentration which is lower than the first impurity concentration and is the lowest in the semiconductor surface layer, and has a thickness of about 2 $\mu$m or more.

An eleventh aspect of the present invention is directed to a method for manufacturing a semiconductor integrated circuit, comprising the steps of preparing an epitaxial wafer having a substrate single crystal, a first epitaxial layer directly formed on the substrate single crystal, and an insulation film formed on the first epitaxial layer, forming, on the epitaxial wafer, a trench and a pit whose openings have different sizes from each other, forming a second epitaxial layer on the trench and the pit in such a thickness as not to fill in the trench and the pit, forming a third epitaxial layer over the epitaxial wafer in such a thickness as to fill in the trench and not to fill in the pit, removing a portion of the third epitaxial layer provided outside the trench and the pit, and flattening a surface of the third epitaxial layer to almost align with a surface of the first epitaxial layer, and forming a semiconductor integrated circuit on the basis of the pit.

According to the first aspect of the present invention, the impurity concentration of the first semiconductor substrate layer of the first circuit section is made different from that of the second semiconductor substrate layer of the second circuit section. Consequently, structures advantageous to resistances which are demanded for different phenomena in the first and second circuit sections in the substrate of the semiconductor integrated circuit can independently be provided in the first and second circuit sections, and desirable resistances can easily be obtained simultaneously for all the different phenomena over the whole substrate of the semiconductor integrated circuit. Furthermore, the impurity concentrations of the first and second semiconductor substrate layers are almost uniform over the layer. Therefore, even if the substrate includes a lot of elements forming the first and second circuit sections, each element can easily have an expected performance.

According to the second aspect of the present invention, the existing epitaxial wafer is used. Consequently, a lot of time and labor required to form the first semiconductor surface layer on the first semiconductor substrate layer can be saved. Thus, a desirable substrate can easily be fabricated.

According to the third aspect of the present invention, the second semiconductor substrate layer and the second semiconductor surface layer can be formed on the first semiconductor substrate layer, and the first and second semiconductor surface layers can easily be integrated.

According to the fourth aspect of the present invention, the thickness of the semiconductor surface layer provided under the first circuit section is made different from that of the semiconductor surface layer provided under the second circuit section. Consequently, thicknesses advantageous to resistances demanded for different phenomena can independently be set in the first and second circuit sections, and desirable resistances can easily be obtained simiultaneously for all the different phenomena over the whole substrate of the semiconductor integrated circuit.

According to the fifth aspect of the present invention, the existing epitaxial wafer is used. Consequently, a lot of time and labor required to form the first semiconductor surface layer on the semiconductor substrate layer can be saved. Thus, a desirable substrate can easily be fabricated.

According to the sixth aspect of the present invention, the second principal plane which is lower than the first principal plane can easily be obtained by the trench.

According to the seventh aspect of the present invention, the second principal plane which is higher than the first principal plane can easily be obtained by the third semiconductor surface layer.

According to the eighth aspect of the present invention, positions of the first and second circuit sections can be recognized by the alignment mark, and positions in which the first and second circuit sections are to be formed can be distinguished from each other by appearances to form an integrated circuit.

According to the ninth aspect of the present invention, a resistance to soft error can further be increased by the heavy metal.

According to the tenth aspect of the present invention, it is possible to obtain a practically sufficient soft error resistance in a storage capacitor which is formed on the substrate of the semiconductor integrated circuit and can store electric charges of about 18 fC to 20 fC, for example.

According to the eleventh aspect of the present invention, a place where the trench was formed can easily be specified on the basis of the pit, and the place where the trench was formed and other places can easily be distinguished to form a semiconductor integrated circuit.

In order to solve the above-mentioned problems, it is an object of the present invention to provide a substrate of a semiconductor integrated circuit which can easily manufacture a semiconductor memory device having a fully high resistances to all of soft error, latch up and ESD and a device on which a memory and a logic are mounted together.

It is another object of the present invention to enhance a soft error resistance also in a substrate of a semiconductor integrated circuit having a well.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 3A to 10B are typical views showing sectional structures of the substrate of the semiconductor integrated circuit in a process of manufacturing the substrate of the semiconductor integrated circuit according to the first embodiment;

FIG. 14 is a graph showing a simulation result of time dependency of a collected electric charge in the structure in FIG. 13;

DESCRIPTION OF THE PREFERRED EMBODIMENTS

First Embodiment

A substrate of a semiconductor integrated circuit according to a first embodiment to the present invention comprises a plurality of different structures such as a combination of a p on p$^-$ structure and a p on p$^+$ structure in a single substrate of a semiconductor integrated circuit, and the like. The structures have arrangement in which a position of each structure that can easily obtain respective resistances to be realized by elements and sections of an integrated circuit corresponds to a position on a substrate of each element and each circuit section of the integrated circuit.

As compared with the prior art, therefore, it is easy to obtain a soft error resistance, a latch up resistance and an ESD resistance which have a high standard in a single integrated circuit.

Figure 1:
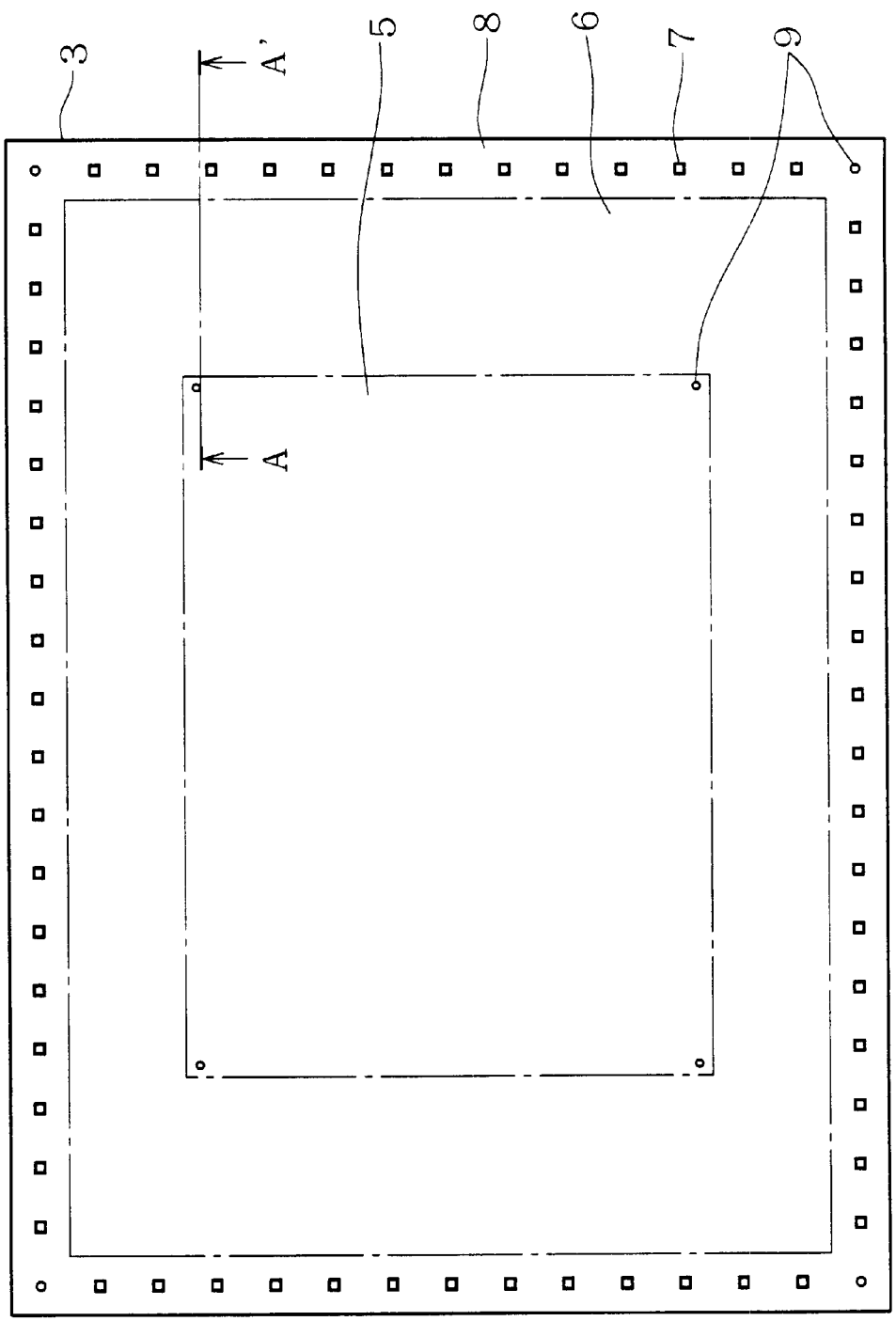
FIG. 1 is a conceptual view showing a planar structure of a semiconductor memory device formed on a substrate of a semiconductor integrated circuit according to a first embodiment.

FIG. 1 is a conceptual view showing a planar structure of a semiconductor memory device formed on the single substrate of the semiconductor integrated circuit according to the first embodiment. The semiconductor memory device shown in FIG. 1 is characterized in that a p on p$^-$ structure is applied to a memory cell section and an input-output section and a p on p$^+$ structure is applied to a logic section.

Figure 45:
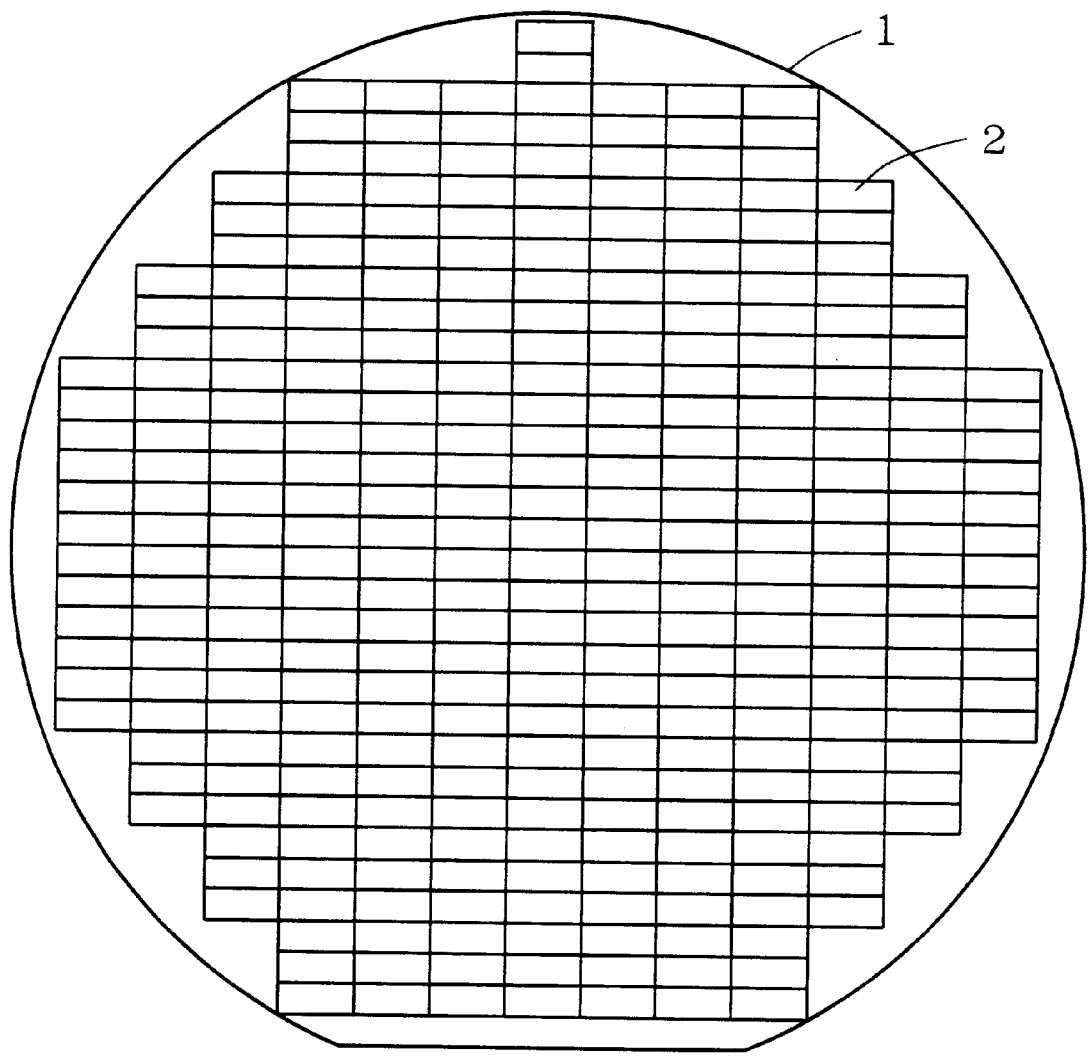
FIG. 45 is a plan view showing a relationship between a substrate of a semiconductor integrated circuit and the integrated circuit.

The semiconductor memory device shown in FIG. 1 is formed on a substrate 3 which is a rectangle having a length of 15 mm and a width of 20 mmn on a plane. The substrate 3 corresponds to a region 2 in a wafer 1 shown in FIG. 45. A memory cell section 5 is provided in the center of the substrate 3. A logic section 6 is provided around the memory cell section 5. Furthermore, an input-output section 8 is provided on the periphery of the logic section 6, and an input-output terminal 7 is provided in a region of the input-output section 8. An alignment mark 9 is provided on four corners of a region of the memory cell section 5 and on four corners of the substrate 3 in the region of the input-output section 8. In FIG. 1, it is needless to say that the alignment mark is not provided in the logic section 6 but may be provided in the logic section 6.

Figure 2:
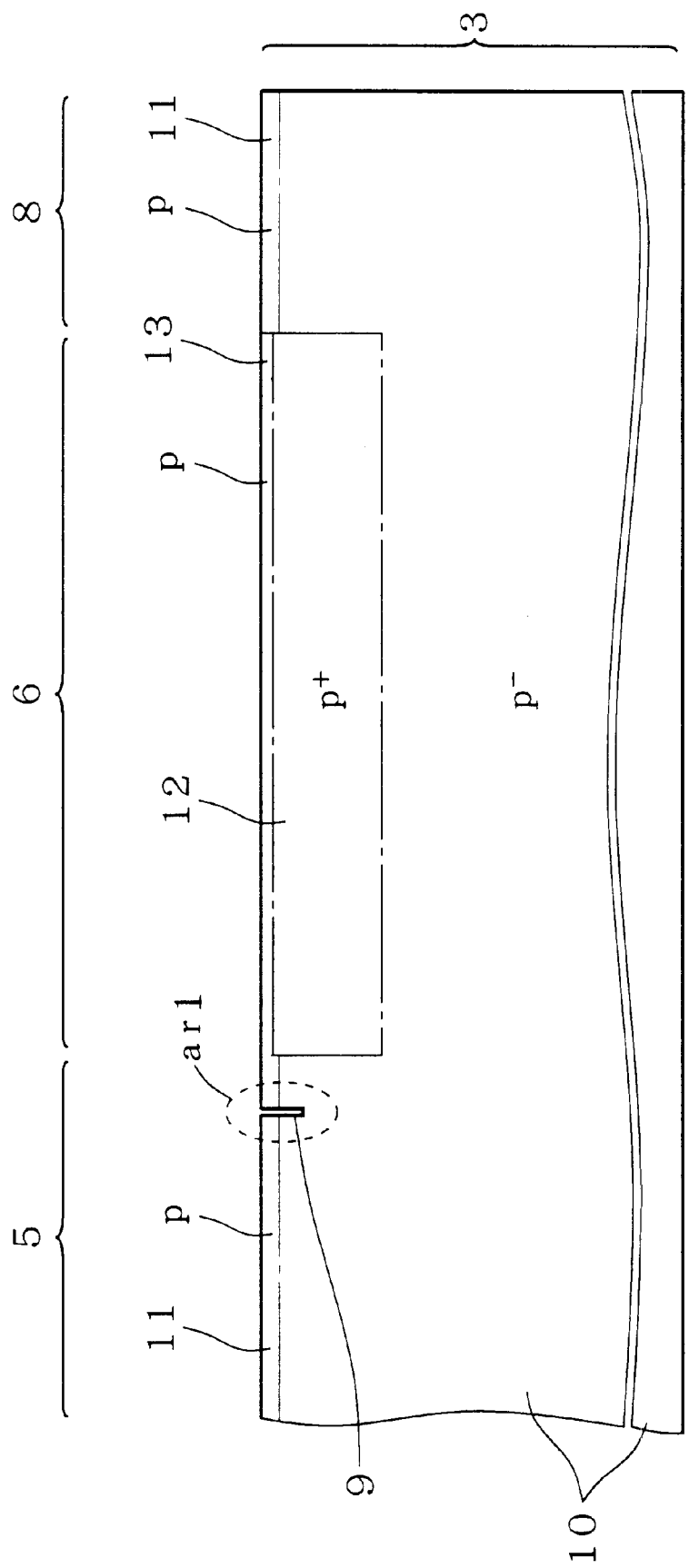
FIG. 2 is a typical view showing a sectional structure taken along the line A–A' in FIG. 1.

FIG. 2 is a typical view showing a sectional structure of the substrate 3 taken along the line A–A' in FIG. 1. A vertical direction in FIG. 2 indicates a thickness (height) of the substrate 3 which is set to 700 μm.

An epitaxial layer 11 (p layer) corresponding to a semiconductor surface layer is formed on a substrate single crystal 10 (p$^-$) corresponding to a semiconductor substrate layer. An epitaxial layer 13 (p layer) corresponding to the semiconductor surface layer is formed on an epitaxial layer 12 (p$^+$ layer) corresponding to the semiconductor substrate layer.

The greatest cause of phenomena in which a malfunctions is induced in each section of the integrated circuit shown in FIG. 1 is soft error in the memory cell section 5, latch up in the logic section 6 and ESD in the input-output section 8.

With reference to FIG. 1, the p on p$^-$ structure is used for the memory cell section 5 and the input-output section 8, and the p on p$^+$ structure is used for the logic section 6. Consequently, the integrated circuit can display high resistances to the soft error, the latch up and the ESD. Referring to the logic section 6, it is desirable that an ohmic voltage drop should be small in the substrate. Therefore, the epitaxial layer 12 (semiconductor substrate layer) having a high impurity concentration is formed on the substrate single crystal 10 (semiconductor substrate layer) having a low impurity concentration to reduce a substrate resistance. The number of elements such as transistors forming circuit sections, for example, the memory cell section 5 and the like is large, that is, thousands, tens of thousands or more. The impurity concentrations of the semiconductor surface layers (epitaxial layers 11 and 13) are almost uniform over the layers. Accordingly, a performance to be expected for each component of each circuit section can easily be obtained.

The semiconductor surface layers of the substrate 3 are common in that they are single crystals which are formed of the same material and have the same orientation on surfaces thereof. For this reason, there is no mark for distinguishing each semiconductor surface layer on an outline basis. In a manufacturing process, a plurality of substrates 3 are cut out of the wafer shown in FIG. 45. Also in that case, it is necessary to put a mark to indicate arrangement positions of the substrates 3. In the substrate 3 of the semiconductor integrated circuit according to the first embodiment, the epitaxial layers 11 and 13 should be arranged corresponding to a position in which each circuit section (the memory cell section 5 or the like) should be formed. Therefore, mask alignment is important during manufacture. The substrates of the semiconductor integrated circuit according to the first embodiment have different impurity concentrations on cutting planes thereof. However, only semiconductor surface layers formed of the same material appear on a surface and there is no height difference. For this reason, it is hard to perform the mask alignment.

In order to eliminate difficulties of the alignment, the alignment mark 9 is formed to accurately recognize the arrangement of the epitaxial layers 11 and 13 on a plane of the substrate 3 seen from above and to precisely perform the mask alignment.

Next, an example of a process of manufacturing the substrate of the semiconductor integrated circuit having the structure shown in FIG. 2 will be described with reference to FIGS. 3A to 10B. FIGS. 3A, 4A, 5A, 6A, 7A, 8A, 9A and 10A are enlarged views showing a region art in FIG. 2, and FIGS. 3B, 4B, 5B, 6B, 7B, 8B, 9B and 10B are typical views showing a section corresponding to FIG. 2. First of all, an epitaxial wafer in which a p-type epitaxial layer 11 is grown in a thickness of about 10 μm on a p$^-$ substrate single crystal 10 is prepared. An insulation film 23 is formed in a thickness of about 0.05 μm on the epitaxial layer 11. Then, the insulation film 23 is covered with a patterned mask and a part of the insulation film 23, a semiconductor surface layer 22 and the substrate single crystal 10 are removed by etching to form a trench 24a and a pit 24b shown in FIGS. 3A and 3B. The trench 24a has a width of about 3 mm, and a region surrounded by the trench 24a (a logic section 6) where a memory cell section 5 is to be formed has a width of about 12 mm. A planar shape of the pit 24b has a size of about 1 μm square. A region where an input-output section 8 is to be formed has a width of about 1 mm.

As shown in FIGS. 4A and 4B, an epitaxial layer 27 which is a p⁺ layer containing boron at a high concentration is grown in a thickness of about 110 μm by a CVD method. The trench 24a has a great width and the pit 24b has a small width. Therefore, an epitaxial layer 27a (semiconductor substrate layer) formed on a bottom face of the trench 24a has a thickness of about 105 μm, while an epitaxial layer 27b formed on a bottom face of the pit 24b has a thickness of about 80 μm, for example. In other words, the thickness of the epitaxial layer 27b of the pit 24b is smaller than that of the epitaxial layer 27a. The reason is that a speed of epitaxial growth of the trench 24a is higher than that of the pit 24b because a gas enters the trench 24a more easily than the pit 24b.

Subsequently, the epitaxial layer 27 formed on the insulation film 23 and sidewalls of the trench 24a and the pit 24b is removed by isotropic etching (see FIGS. 5A and 5B).

Then, an epitaxial layer 28 which is a p layer is formed by using a CVD system. As shown in FIGS. 6A and 6B, a portion where the trench 24a is formed is almost filled in so that an epitaxial layer 12 is formed. Therefore, a surface of the epitaxial layer 28 provided on the epitaxial layer 12 is almost horizontal. However, the pit 24b has not been filled in and a narrow and deep hole remains. For this reason, the epitaxial layer 28 presents an appearance which reflects a shape of the hole in the pit 24b.

A resist for covering a region where the trench 24a is formed and having a thickness of about 1 μm is formed over the whole substrate 3 of the semiconductor integrated circuit. As shown in FIGS. 7A and 7B, a patterned resist 29 remains. The patterning is performed on the basis of the pit 24b. The epitaxial layer 28 has little height difference on a surface thereof and only the alignment mark 9 exists. Therefore, alignment can be performed with high precision.

Anisotropic etching is performed by using the resist 29 as a mask. Thus, a part of the semiconductor surface layer 28 is removed by the etching (see FIGS. 8A and 8B). After the etching, the epitaxial layer 28 having a thickness of about 0.01 μm remains on the insulation film 23.

The resist 29 is removed and the epitaxial layer 28 provided on the insulation film 23 is polished and planarized by chemical mechanical polishing as shown in FIGS. 9A and 9B. The polished epitaxial layer 28 has a thickness of about 5 μm.

By removing the insulation film 23, a substrate having the same structure as that of the substrate 3 of the semiconductor integrated circuit having the sectional structure shown in FIG. 2 can be formed.

In order to form a semiconductor integrated circuit on the substrate 3 of the semiconductor integrated circuit, for example, an oxide film 30 having a thickness of about 0.01 μm is provided over the whole substrate of the semiconductor integrated circuit. Then, a resist 31 having a thickness of about 1 μm is formed on the oxide film 30 (see FIGS. 10A and 10B). The resist 31 is subjected to patterning. During the patterning, mask alignment can be performed with high precision by using a height difference of the pit 24b so as to make a positional relationship between each circuit section to be formed on the semiconductor substrate 3 and the epitaxial layers 11 and 28 coincident with each other. Thus, it is possible to manufacture a substrate of a semiconductor integrated circuit in which an impurity concentration of a semiconductor substrate layer provided under first and second semiconductor surface layers where each circuit section of the integrated circuit is to be formed is suitable for a function of each circuit section. Device structures such as a transistor, an isolation, a well and the like which are not shown are formed on the epitaxial layers 11 and 28 shown in FIGS. 10A and 10B and thereabove, for example.

While the case where the alignment mark 9 is formed on the memory cell section 5 has been described with reference to FIGS. 3A to 10B, it may be formed in a portion other than the circuit sections such as the memory cell section 5, the logic section 6, the input-output section 8 and the like.

While the p on p⁻ structure has been formed on the basis of the p on p⁺ structure in the description of FIG. 2, the p on p⁺ structure may be formed on the basis of the p on p⁻ structure, for example. Furthermore, the p on p⁺⁺ structure may be used in place of the p on p⁺ structure.

A relationship between the thicknesses of the epitaxial layers 11 and 22 and those of the epitaxial layers 13 and 28 is not limited to the description of FIGS. 2 to 10B but the above-mentioned effects can be obtained irrespective of any thickness.

FIG. 1 shows an example of circuit arrangement. If the above-mentioned structure is applied to another circuit arrangement for each circuit function, the same effects can be obtained.

While the two epitaxial layers 11 and 13 have been the p layers in the above-mentioned embodiment, the impurity concentrations of the same p layers may be different or equal. In any case, the effects of the above-mentioned embodiment can be obtained.

Second Embodiment

A substrate of a semiconductor integrated circuit according to a second embodiment is a p on p⁺⁺ substrate, and includes a p⁺ layer as a semiconductor substrate layer in a region where an input-output section 8 is to be formed. The region where the input-output section 8 is to be formed has a width of about 1 mm, a region where a logic section 6 is to be formed has a width of about 3 mm, and a region where a memory cell section 5 is to be formed has a width of about 12 mm.

As compared with the prior art, therefore, it is easier to obtain a soft error resistance, a latch up resistance and an ESD resistance which have a high standard in a single integrated circuit.

Figure 11:
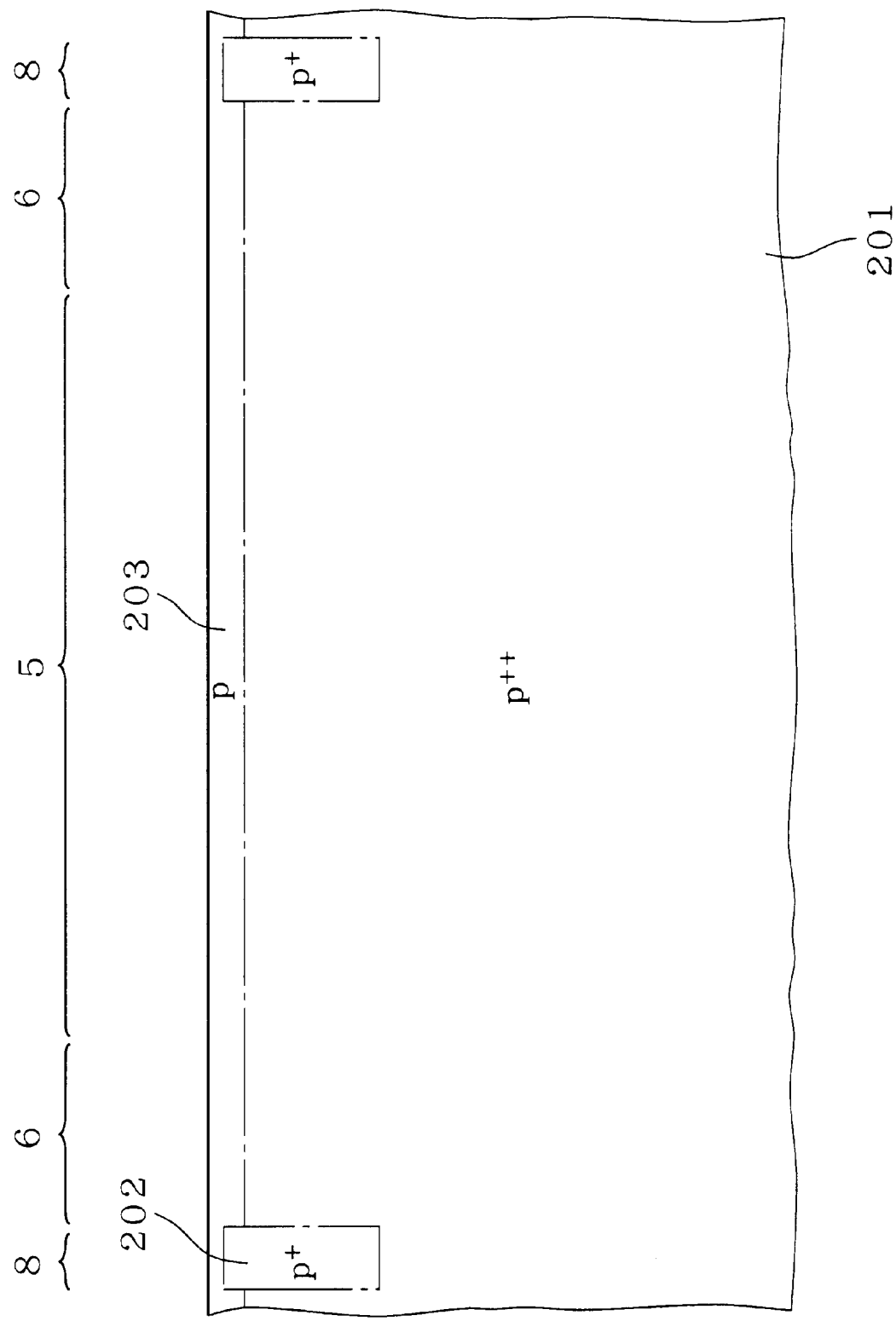
FIG. 11 is a typical view showing a sectional structure of a substrate of a semiconductor integrated circuit according to a second embodiment.

FIG. 11 is a typical view showing a sectional structure of the substrate of the semiconductor integrated circuit according to the second embodiment. In FIG. 11, the reference numeral 201 denotes a substrate single crystal which is a p⁺⁺ layer having a thickness of about 700 μm, the reference numeral 202 denotes an epitaxial layer (p⁺ layer) which is grown in a thickness of about 100 μm from a bottom face of a trench formed on the substrate single crystal 201, and the reference numeral 203 denotes an epitaxial layer (p layer) which is grown in a thickness of about 7 μm on the substrate single crystal 201 or about 3 μm on the epitaxial layer 202. The epitaxial layer 202 corresponds to a semiconductor substrate layer, and the epitaxial layer 203 corresponds to a semiconductor surface layer. In the substrate of the semiconductor integrated circuit according to the second embodiment, the semiconductor surface layer and the semiconductor substrate layer have impurity concentrations which are different from each other.

As a structure of the substrate of the integrated circuit, a p on p⁺⁺ structure is used for the memory cell section 5 and the logic section 6. By employing such a structure, most of electrons generated by injected α-rays are recombined with holes in the epitaxial layer 201 ($p^{++}$ layer) containing boron at a high concentration in the memory cell section 5. Consequently, the number of the electrons which reach a substrate surface by diffusion or drift is considerably reduced as compared with a p on $p^+$ substrate. In the logic section 6, the epitaxial layer 201 is the $p^{++}$ layer. Therefore, an ohmic voltage drop in the substrate is reduced. Consequently, latch up is suppressed more than in the case where the p on $p^+$ substrate is used.

Figure 40:
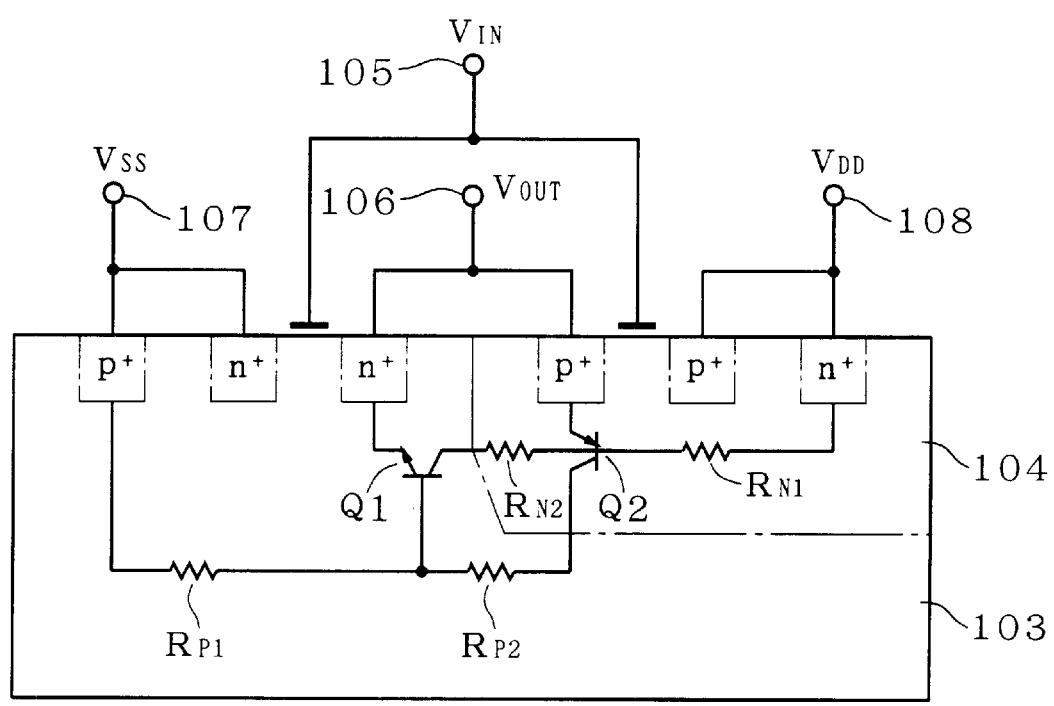
FIG. 40 is a typical diagram showing an example of a sectional structure of a CMOS transistor.
Figure 41:
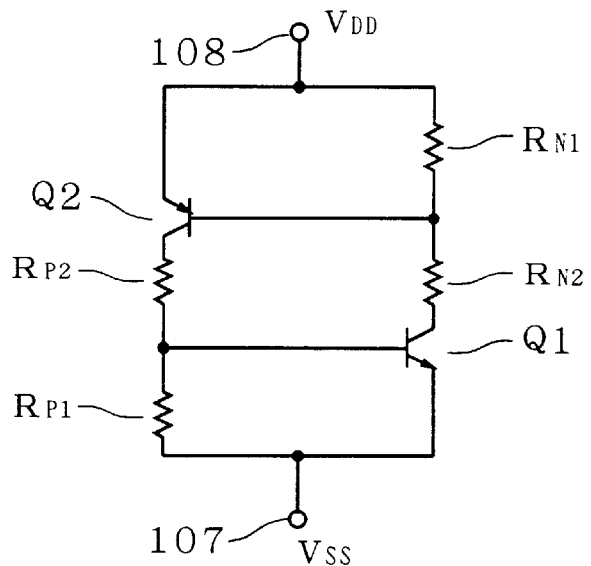
FIG. 41 is an equivalent circuit diagram for explaining operation of the CMOS transistor in FIG. 40.
Figure 42:
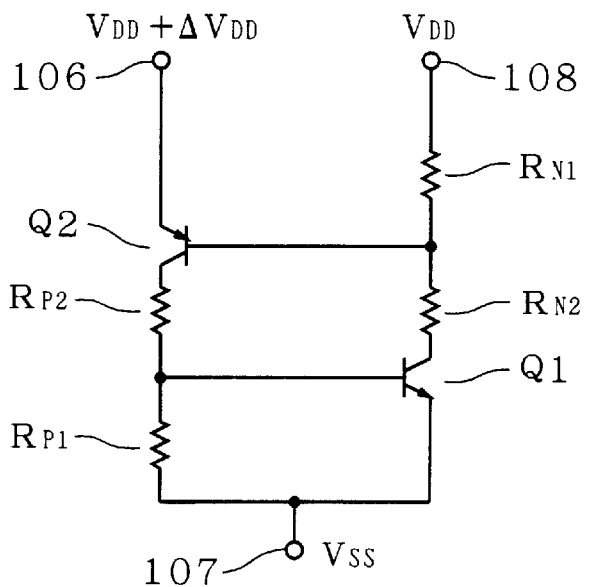
FIG. 42 is an equivalent circuit diagram for explaining the operation of the CMOS transistor in FIG. 40.
Figure 43:
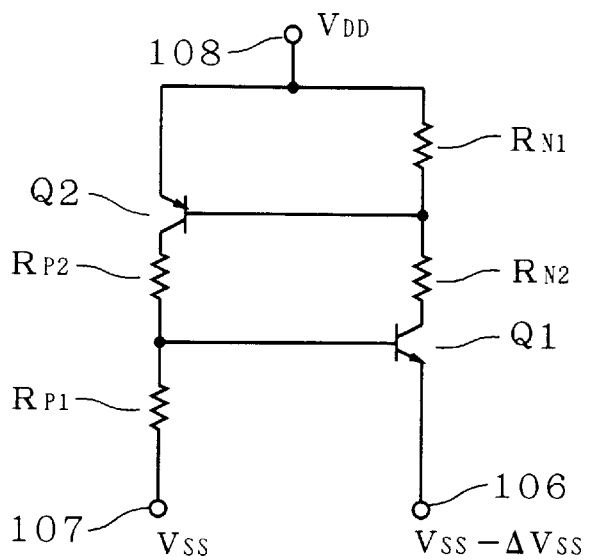
FIG. 43 is an equivalent circuit diagram for explaining the operation of the CMOS transistor in FIG. 40.
Figure 44:
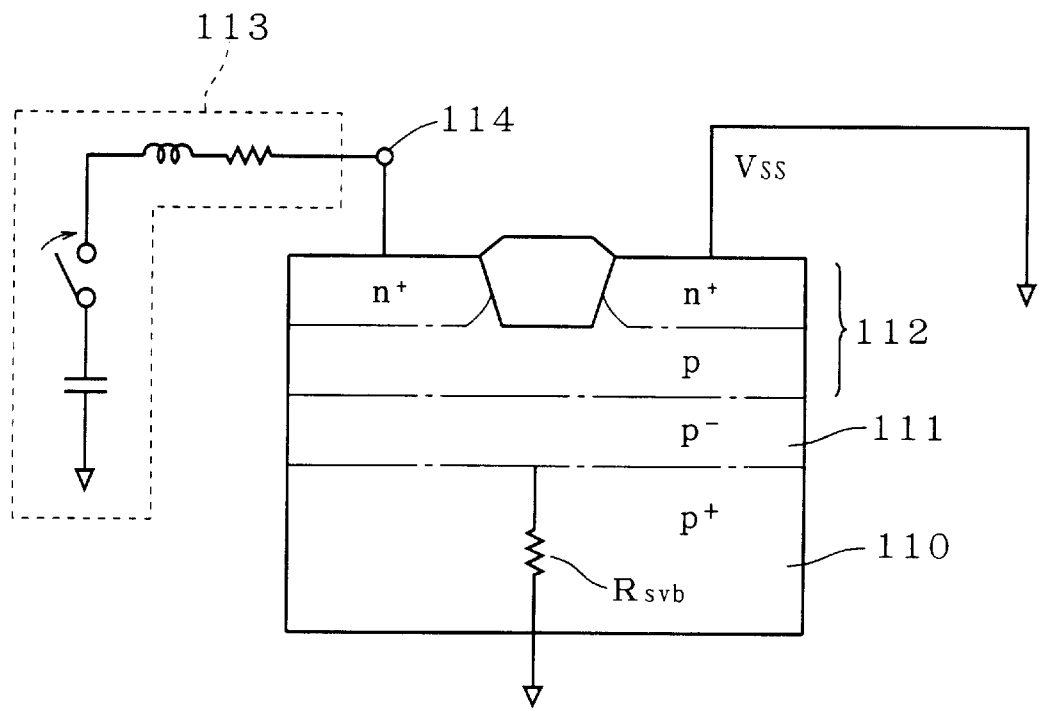
FIG. 44 is a conceptual diagram for explaining ESD.

Referring to the ESD resistance which becomes a problem in the input-output section 8, a substrate resistance is reduced so that a parasitic bipolar transistor (npn lateral type) shown in FIG. 40 operates with difficulty and at voltage of an electrode is held at a higher value.

In the input-output section 8 which is shown, a part of the epitaxial layer 203 (p layer) and the substrate single crystal 201 ($p^{++}$ layer) are replaced with the $p^+$ layer (epitaxial layer 202) having a higher resistance than that of the $p^{++}$ layer. Therefore, the ESD resistance is increased. Such replacement is performed in the following manner by using an epitaxial wafer in which a p-type epitaxial layer is formed on a $p^{++}$ substrate single crystal. A trench is dug in the epitaxial wafer to form a $p^+$-type epitaxial layer. Then, the p-type epitaxial layer is grown on the $p^+$-type epitaxial layer.

Even if the epitaxial layer 202 which is the $p^+$ layer is replaced with a $p^-$ layer having a higher resistance, the same effects as in the second embodiment can be obtained.

Third Embodiment

A substrate of a semiconductor integrated circuit according to a third embodiment is a p on $p^-$ substrate, and includes a $p^{++}$ layer or a $p^+$ layer as a semiconductor substrate layer in a region where a memory cell section 5 and a logic section 6 are to be formed.

As compared with the prior art, therefore, it is easier to obtain a soft error resistance, a latch up resistance and an ESD resistance which have a high standard in a single integrated circuit.

Figure 12:
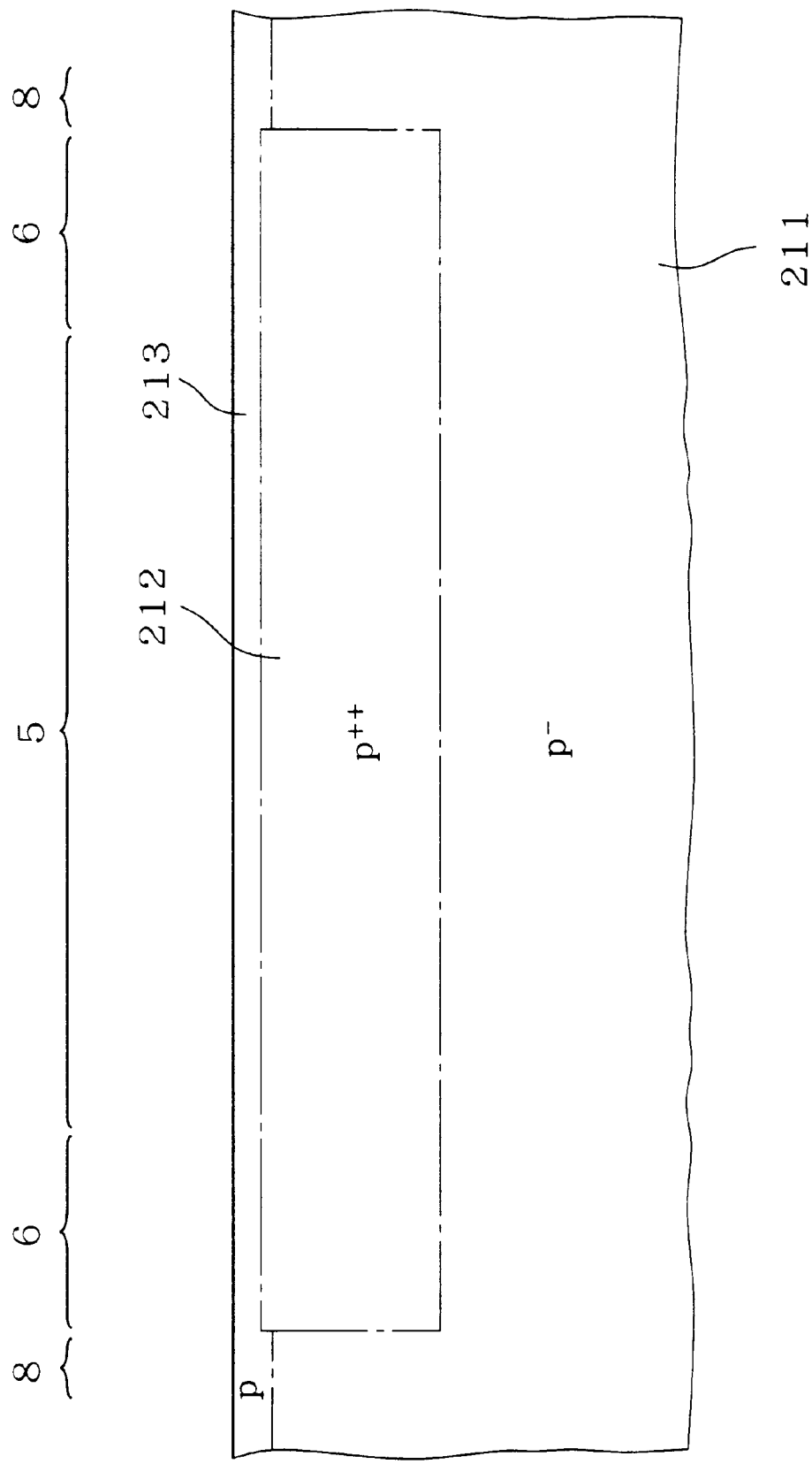
FIG. 12 is a typical view showing a sectional structure of a substrate of a semiconductor integrated circuit according to a third embodiment.

FIG. 12 is a typical view showing a sectional structure of the substrate of the semiconductor integrated circuit according to the third embodiment. In FIG. 12, the reference numeral 211 denotes a substrate single crystal which is a $p^-$ layer having a thickness of about 700 μm, the reference numeral 212 denotes an epitaxial layer ($p^{++}$ layer) which is grown in a thickness of about 50 μm from a bottom face of a trench formed on the substrate single crystal 211, and the reference numeral 213 denotes an epitaxial layer (p layer) which is grown in a thickness of about 7 μm on the substrate single crystal 211 or about 5 μm on the epitaxial layer 212. The epitaxial layer 212 corresponds to a semiconductor substrate layer, and the epitaxial layer 213 corresponds to a semiconductor surface layer.

The epitaxial layer 212 ($p^{++}$ layer) is buried in the memory cell section 5 and the logic section 6. By employing such a structure, most of electrons generated by injected α-rays are combined with holes in the $p^{++}$ layer containing boron at a high concentration. Therefore, it is harder for the electrons to reach the substrate surface than in the p on $p^-$ substrate. Consequently, the soft error is caused with difficulty.

In the logic section 6, the epitaxial layer 212 is the $p^{++}$ layer. Therefore, an ohmic voltage drop in the substrate is reduced. Consequently, latch up is suppressed more than in the case where the p on $p^-$ substrate is exactly used. Even if the above-mentioned epitaxial layer 212 acting as the $p^{++}$ layer is replaced with the $p^+$ layer, the same effects can be obtained.

In the input-output section 8, the p on $p^-$ structure is used so that a resistance of the substrate single crystal is increased. Therefore, the parasitic bipolar transistor (npn lateral type) shown in FIG. 40 easily operates. Consequently, a voltage of an electrode is not kept high so that an ESD immunity is increased.

While the semiconductor substrate layer formed on the substrate single crystal has been the epitaxial layer in the first to third embodiments, an impurity may be implanted into the substrate single crystal by ion beams or the like to form a layer having a different concentration, for example. Even if a p layer is subjected to epitaxial growth on the substrate single crystal thus treated it is possible to obtain a substrate having the same effects as in the first to third embodiments.

Fourth Embodiment

A substrate of a semiconductor integrated circuit according to a fourth embodiment is characterized in that a thickness of a semiconductor surface layer (p-type epitaxial layer) having a p on $p^+$ structure, a p on $p^-$ structure or a p on $p^{++}$ structure is varied depending on a place among a memory cell section 5, a logic section 6 and an input-output section 8 in the semiconductor substrate shown in FIG. 1, for example.

Figure 13:
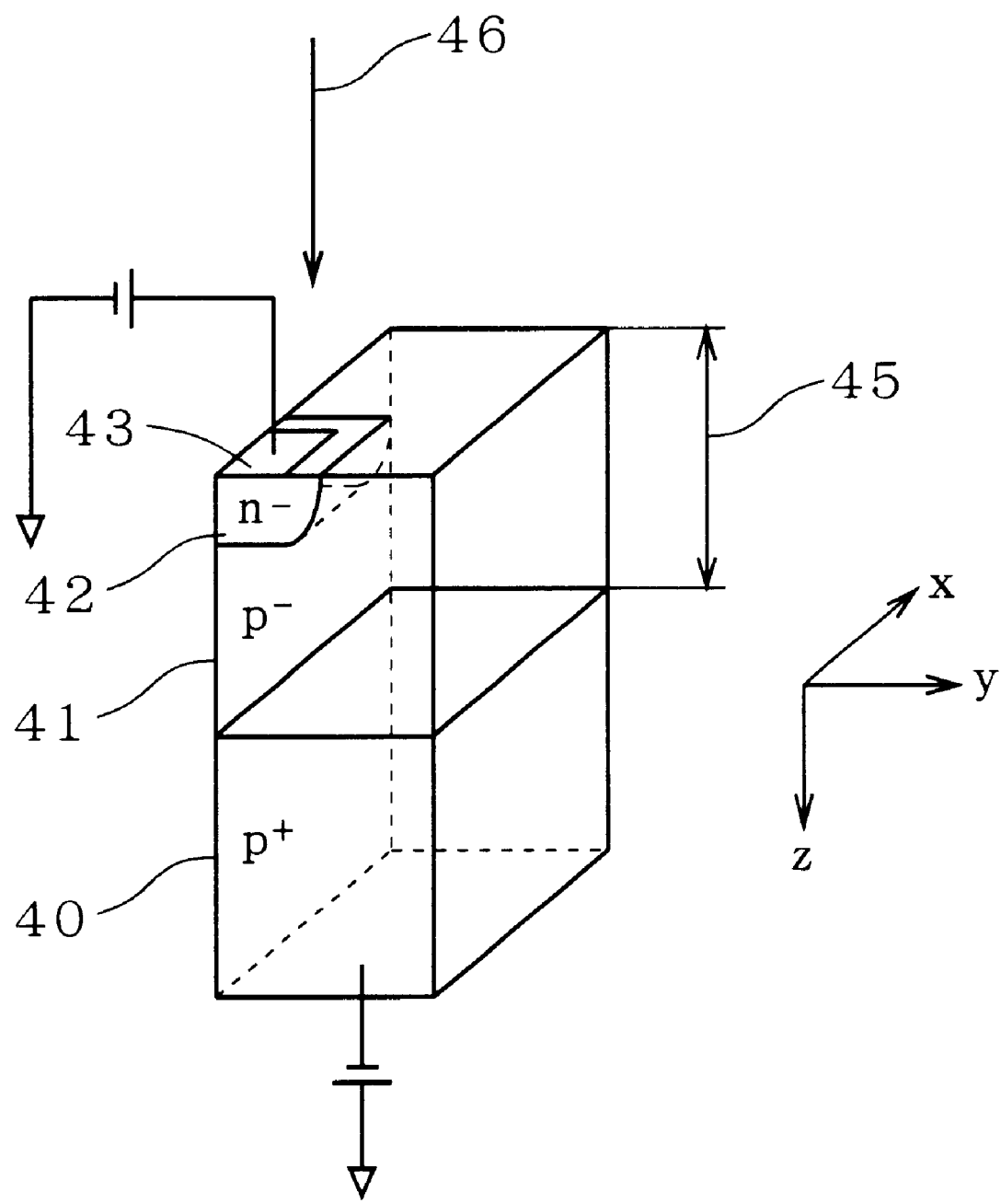
FIG. 13 is a perspective view showing a structure which is a simulation object.

Prior to description of the substrate of the semiconductor integrated circuit according to the fourth embodiment of the present invention, phenomena which are the background of the fourth embodiment will be explained by using a simulation result. FIG. 13 is a perspective view showing a structure for simulating a collected electric charge obtained when a quarter of α-particle is injected into the p on $p^+$ structure. In the structure of FIG. 13, a voltage of 0 V is applied to a $p^+$-type substrate single crystal (hereinafter referred to as a $p^+$ layer) 40, a p-type single crystal (hereinafter referred to as a p layer) 41 is formed on the $p^+$ layer 40, and a voltage of 3 V is applied to an n diffusion layer 42 formed on a part of the p layer 41. In the case where a soft error simulation is performed by α-rays, it is necessary to accurately calculate three-dimensional spread of electrons generated by the α-rays. The reason why a quarter of α-particle is injected by the simulation is that an analytic region (where the simulation is to be performed) should be reduced in order to save a calculation time. Assuming that the a quarter of α ray is injected, the spread of the electrons generated in the semiconductor substrate is smaller than in the case where one α-ray is injected. Consequently, the analytic region can be reduced. By this simulation, the α-rays are injected into an edge of the analytic region. Consequently, only a quarter of a four-fold symmetrical analytic region is simulated. Therefore, it is sufficient that a collected electric charge can be obtained with one a ray injected by multiplying a simulation result by 4.

In a state shown in FIG. 13, that is, a state in which the voltage of 3 V is applied to the diffusion layer 42 and the voltage of 0 V is applied to the $p^+$ layer 40, only a quarter of α-particle is injected into a vicinity 43 of the center of the diffusion layer 42 in a vertical direction (shown by an arrow 46). A simulation is performed by checking the number of minority carriers generated by the α-particle injection and collected into the diffusion layer 42 formed on a substrate surface of the semiconductor integrated circuit. The simulation is performed for p on $p^+$ structures in which the p layer 41 has thicknesses of 5 μm and 7 μm (shown by an arrow 45), and a CZ substrate having a constant boron concentration. According to a result of the simulation, it is apparent that a soft error resistance is smaller if a collected electric charge is greater. The simulation was performed with the α-particle having injection energies of 1 MeV and 5 MeV. A range of the α-particle having the injection energy of 1 MeV is about 5 μm, and a range of the α-particle having the injection energy of 5 MeV is about 23 μm.

In the p on $p^+$ structure including the $p^+$ layer 40 having the same boron concentration, the p layer 41, that is, the semiconductor surface layer having a greater thickness on which the integrated circuit is to be formed has a soft error resistance increased. This can easily be confirmed if an area of a source/drain diffusion layer of a MOS transistor is small. The result of the three-dimensional simulation suggests that the soft error immunity is increased if the thickness is greater.

FIG. 14 shows a collected electric charge obtained after the α-particles are injected at a time 0. The total of the collected electric charge is almost saturated at 100 ps. It is suggested that a drift in a depletion layer is a dominant mechanism for electric charge collection because the electrons are collected in a short time of 100 ps. By comparison among the structures, the collected electric charge is reduced in order of the substrate of the semiconductor integrated circuit including the semiconductor surface layer having a thickness of 5 μm (which is shown in a solid line), the substrate of the semiconductor integrated circuit including the semiconductor surface layer having a thickness of 7 μm (which is shown in a dotted line) and the CZ substrate (shown in a broken line).

The reason will be described below with reference to FIG. 15.

Figure 15:
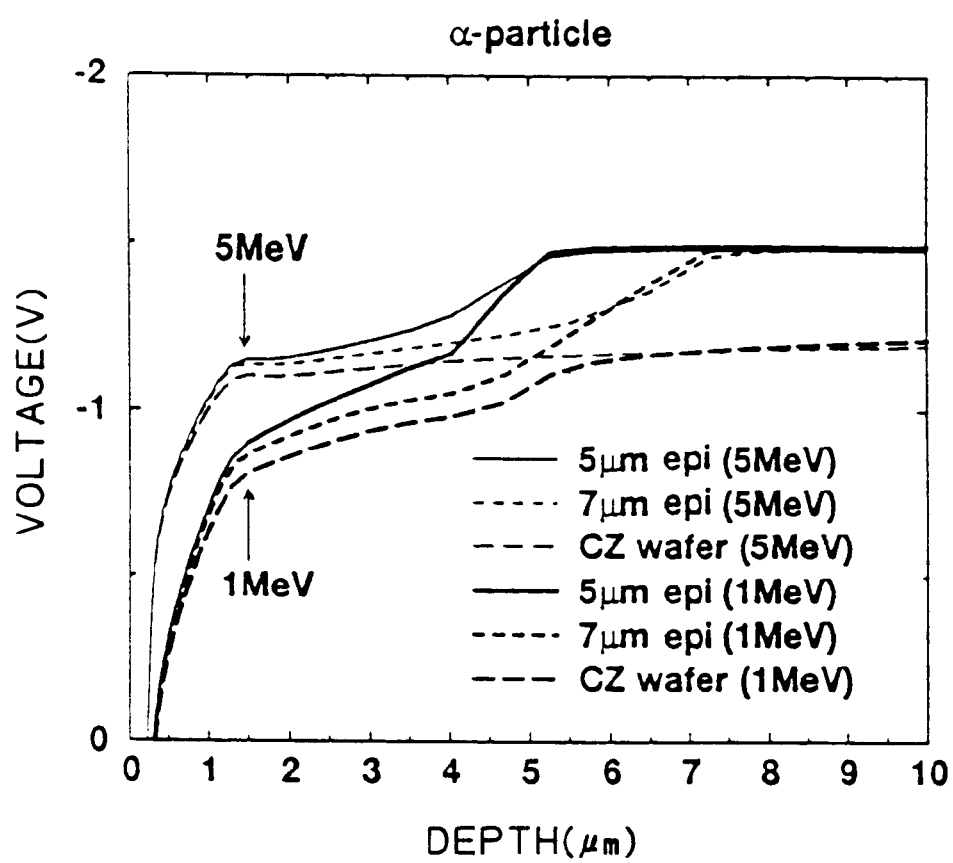
FIG. 15 is a graph showing a simulation result of a potential distribution in a direction of a depth during electric charge collection.
Figure 16:
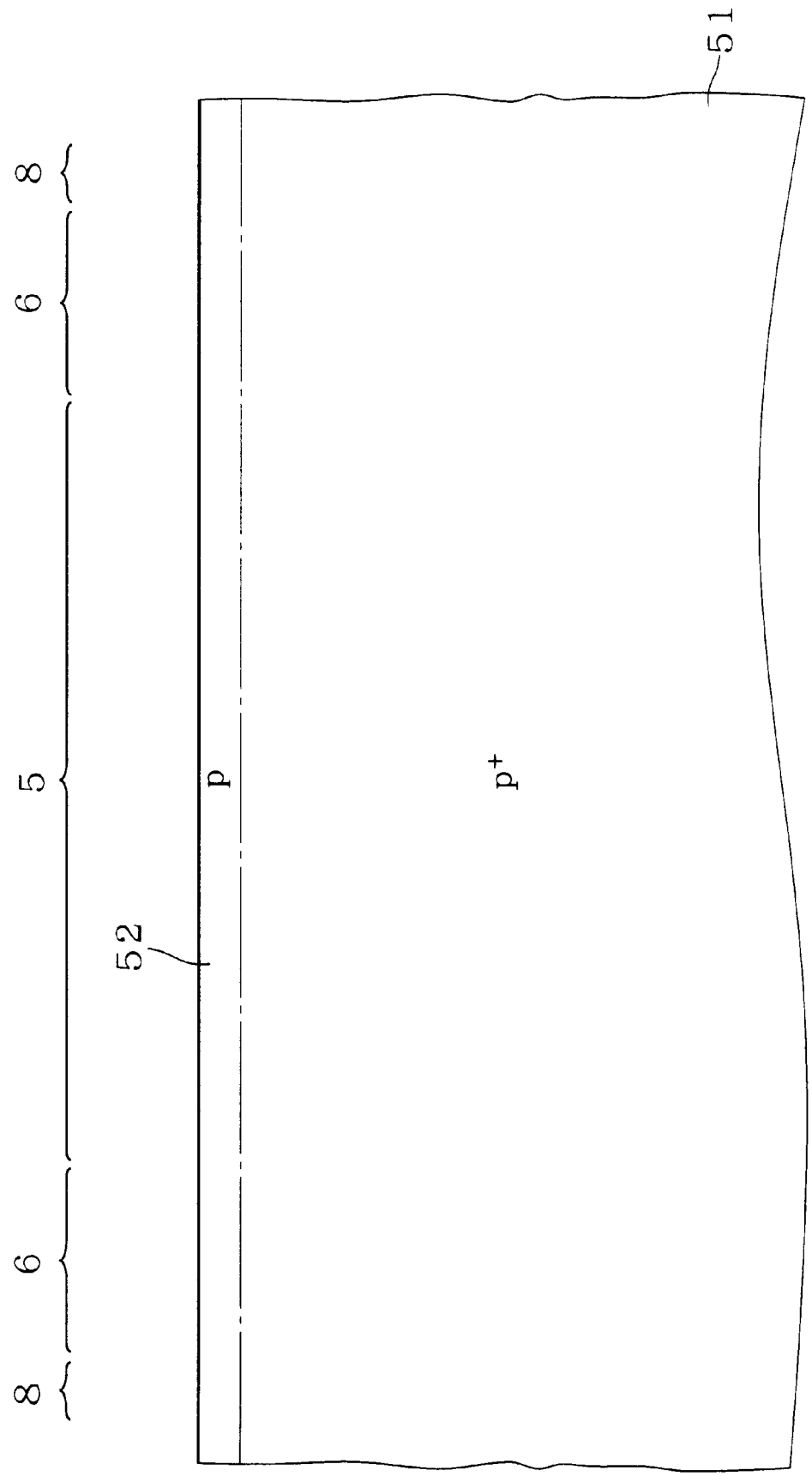
FIG. 16 is a sectional view showing a process of manufacturing a substrate of a semiconductor integrated circuit according to a fourth embodiment.

FIG. 15 is a graph showing a distribution of a potential generated just below the diffusion layer 42 in a direction of a depth when 2 ps passes after the α-particles are injected. A gradient of the potential in a direction of a surface in the semiconductor surface layer having a thickness of 5 μm is greater than that of the potential in the semiconductor surface layer having a thickness of 7 μm. For this reason, the collected electric charge is increased more in the case where the epitaxial substrate including the semiconductor surface layer having a thickness of 5 μm is used than in the case where the epitaxial substrate including the semiconductor surface layer having a thickness of 7 μm is used. A gradient of the potential in the CZ substrate is smaller than in the epitaxial substrate. Accordingly, the collected electric charge is increased more in the epitaxial substrate than in the CZ substrate. More specifically, it is apparent from the simulation that the soft error resistance of a CZ wafer is greater than that of an epitaxial wafer and that the structure of the epitaxial wafer including the semiconductor surface layer having a greater thickness has a greater soft error resistance.

The reason why the collected electric charge is greater with the α-particle having an injection energy of 1 MeV than an injection energy of 5 MeV is that the α-particle having the injection energy of 1 MeV generates snore electron-hole pairs on the substrate surface of the semiconductor integrated circuit.

A structure of the substrate of the semiconductor integrated circuit and a manufacturing method according to the fourth embodiment of the present invention will be described below with reference to the drawings.

FIGS. 16 to 21 are sectional views for explaining the method for manufacturing the substrate of the semiconductor integrated circuit according to the fourth embodiment. First of all, a p on $p^+$ substrate including an epitaxial layer 52 having a uniform thickness is prepared (see FIG. 16). The epitaxial layer 52 is formed on a substrate single crystal 51. The substrate single crystal 51 is a $p^+$ layer, and the epitaxial layer 52 is a p layer.

Figure 17:
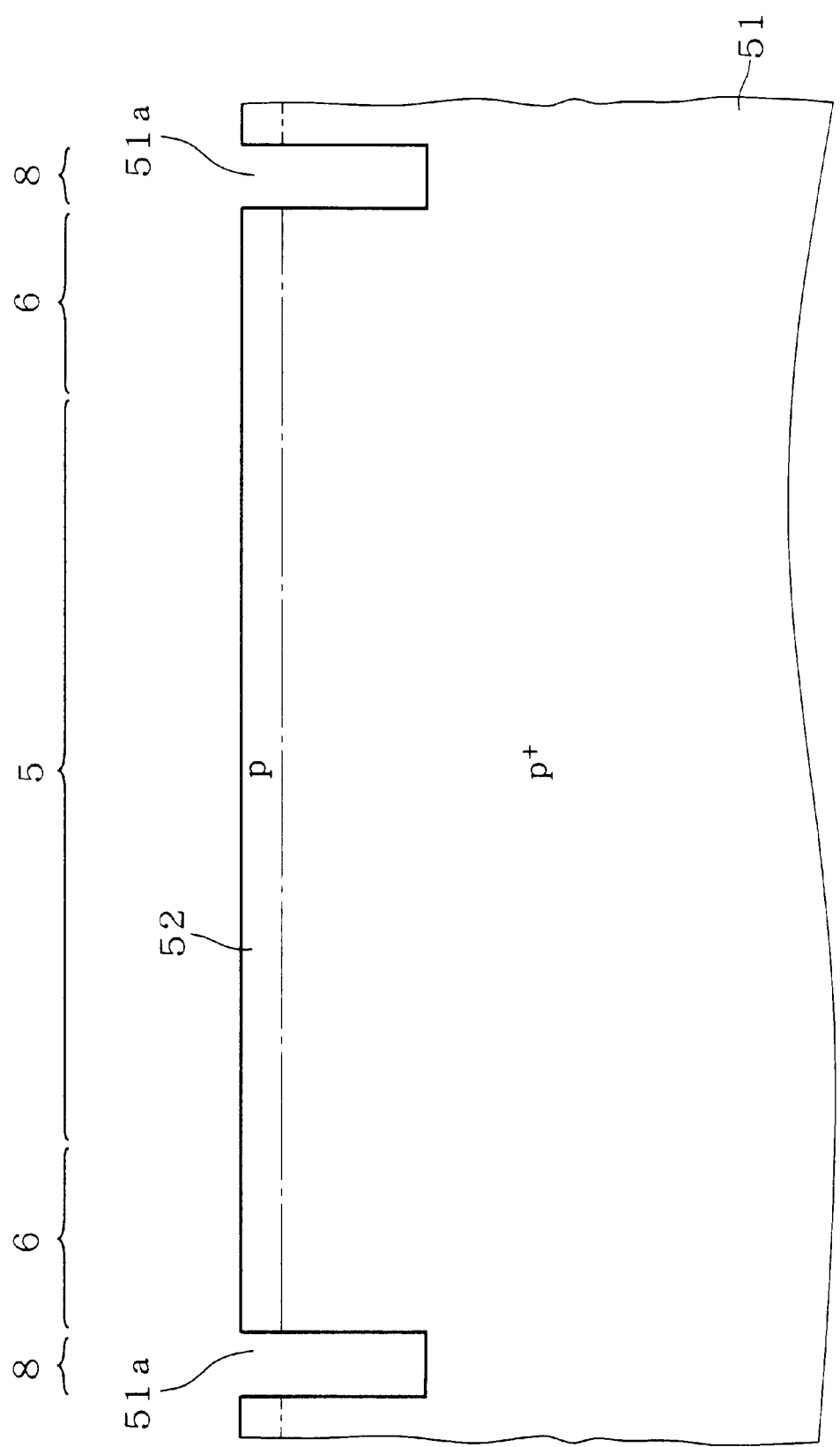
FIG. 17 is a sectional view showing the process of manufacturing the substrate of the semiconductor integrated circuit according to the fourth embodiment.
Figure 18:
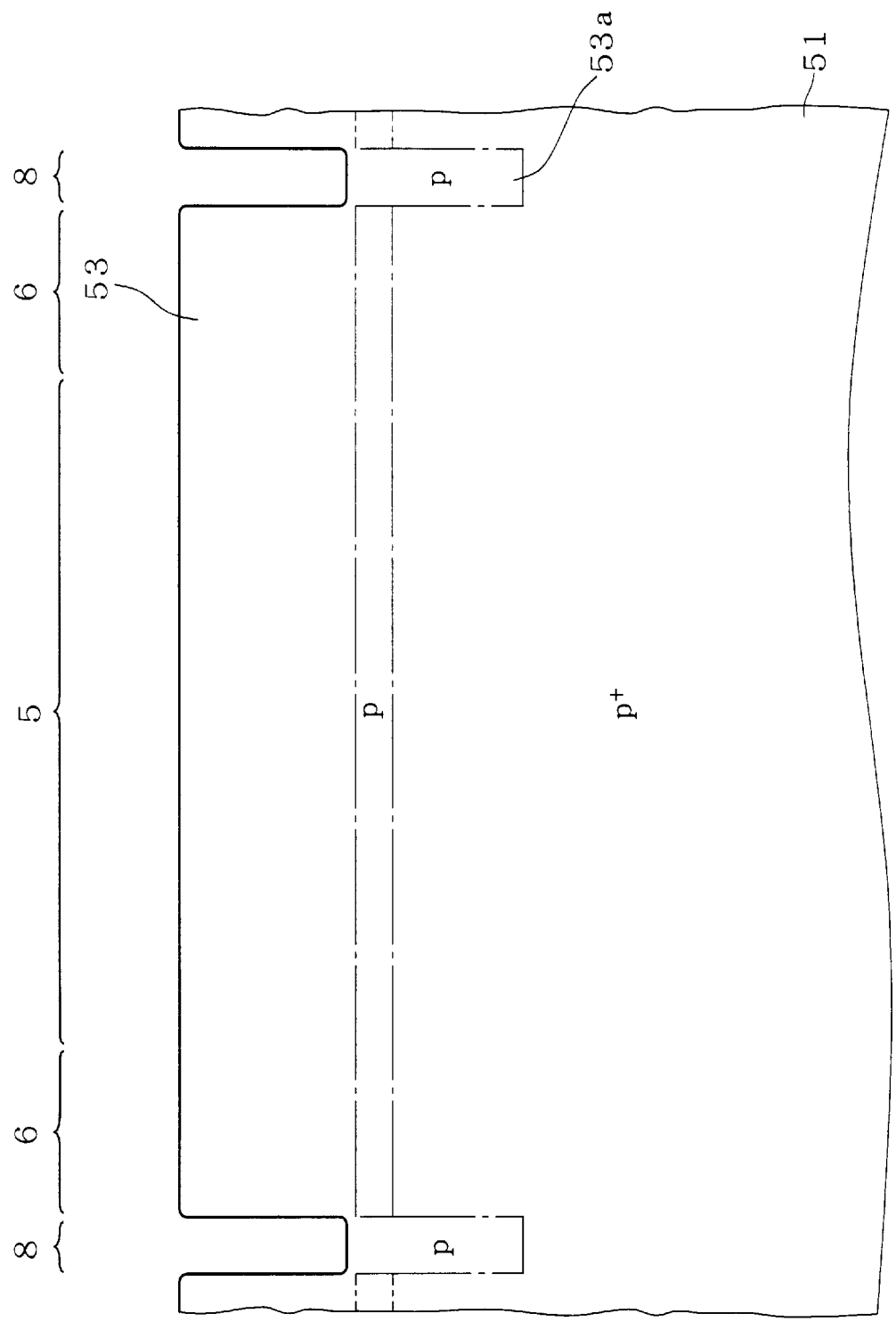
FIG. 18 is a sectional view showing the process of manufacturing the substrate of the semiconductor integrated circuit according to the fourth embodiment.
Figure 19:
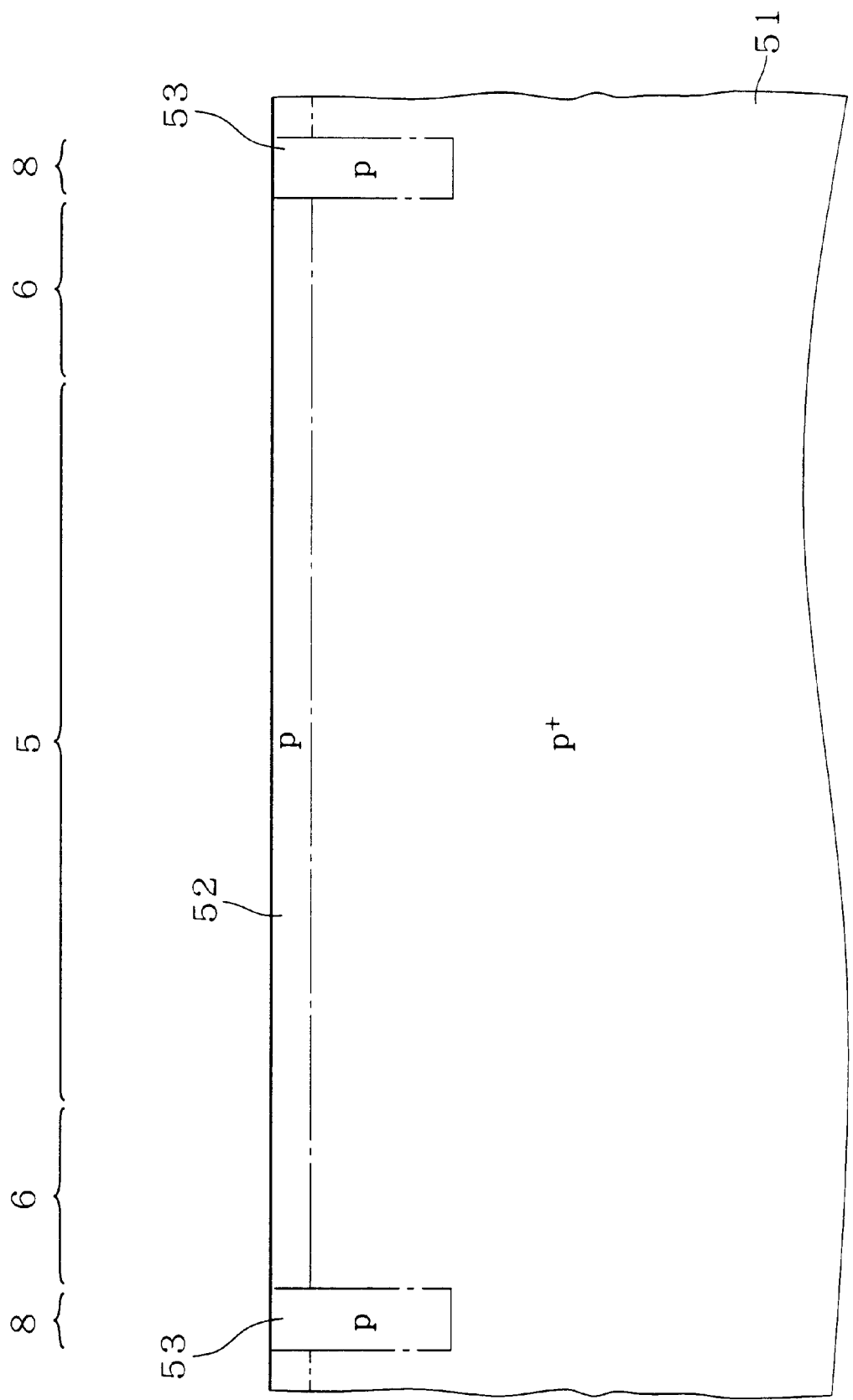
FIG. 19 is a sectional view showing the process of manufacturing the substrate of the semiconductor integrated circuit according to the fourth embodiment.

As shown in FIG. 17, a part of the substrate single crystal 51 and the epitaxial layer 52 which are provided in a region where an input-output section 8 is to be formed are removed by anisotropic etching by means of a patterned mask. Consequently, a trench 51a is formed.

The whole substrate of the semiconductor integrated circuit is subjected to epitaxial growth to form a p-type epitaxial layer 53. In this case, the epitaxial layer 53 is also grown on a bottom face of the trench 51a by using the substrate single crystal 51 as an origin (see FIG. 18). For example, a substrate surface of the semiconductor integrated circuit is polished by CMP (Chemical Mechanical Planarization) to form a structure shown in FIG. 19. While a structure in which the epitaxial layer 53 does not remain on the epitaxial layer 52 has been formed, the epitaxial layer 53 may remain on the epitaxial layer 52.

Figure 20:
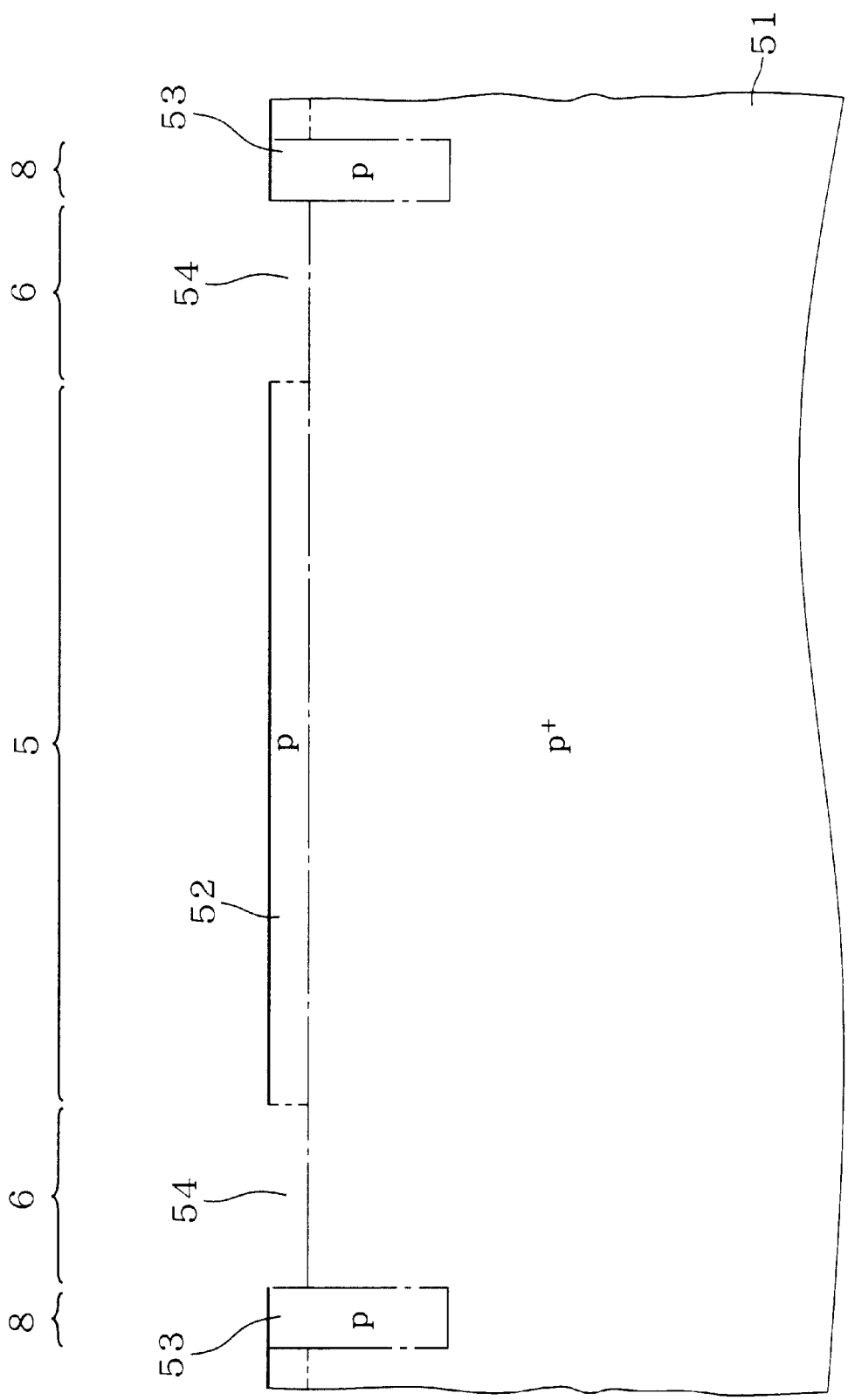
FIG. 20 is a sectional view showing the process of manufacturing the substrate of the semiconductor integrated circuit according to the fourth embodiment.

The epitaxial layer 52 in a region where a logic section 6 is to be formed is removed by anisotropic etching, and patterning is performed as shown in FIG. 20. Consequently, a trench 54 is formed.

Figure 21:
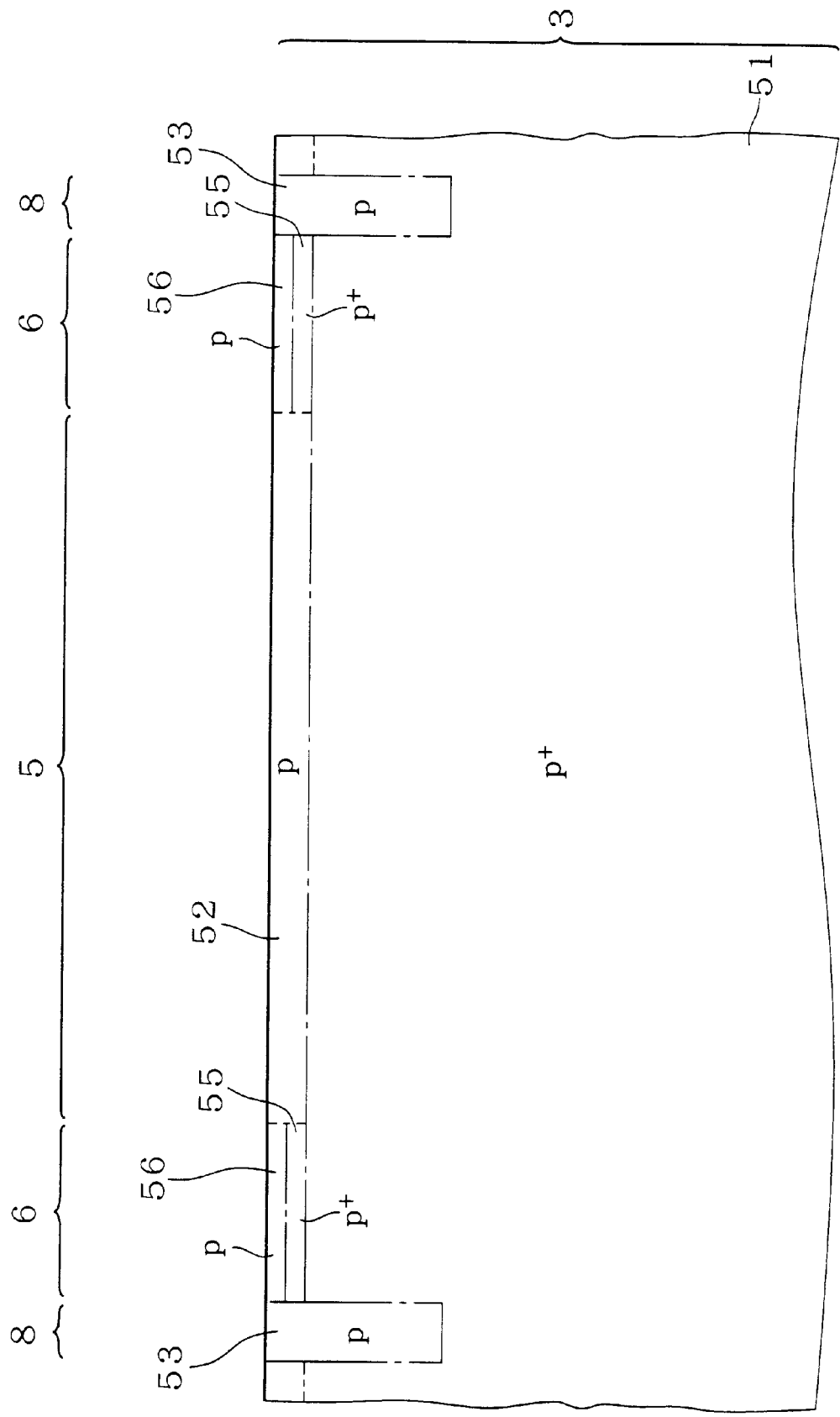
FIG. 21 is a sectional view showing the process of manufacturing the substrate of the semiconductor integrated circuit according to the fourth embodiment.

An epitaxial layer 55 and an epitaxial layer 56 are subjected to epitaxial growth so as to fill in the trench 54 shown in FIG. 20. The epitaxial layer 55 is a $p^+$ layer, and the epitaxial layer 56 is a p layer. Then, a surface of the substrate 3 of the semiconductor integrated circuit is flattened by the CMP so that a structure shown in FIG. 21 is formed. Device structures such as a transistor, an isolation, a well and the like which are not shown are formed on surfaces of the epitaxial layers 52, 53 and 56. In the manufacturing process, an alignment mark is used to enhance precision of positions in which the epitaxial layers 52, 53 and 56 are to be formed. Since a way to use the alignment mark has been described in the first embodiment, its description will be omitted. For example, a pit for the alignment mark is formed simultaneously with formation of the trench 51a shown in FIG. 17. The epitaxial layer 53 is formed on the same conditions for forming the epitaxial layer 12 shown in FIGS. 3B, 4B and 5B. Consequently, the alignment mark can be formed. In the manufacturing process shown in FIGS. 3B, 4B, 5B, 6B, 7B, 8B, 9B and 10B, for example, the impurity concentration of the substrate single crystal 10 is set equal to that of the epitaxial layer 12 so that the semiconductor integrated circuit according to the fourth embodiment can be obtained.

As is apparent from the three-dimensional simulation results shown in FIGS. 14 and 15, if an area of a source/drain diffusion layer of a transistor is small, a p-type epitaxial layer (semiconductor surface layer) having a smaller concentration and a greater thickness has a greater soft error resistance on the p on $p^+$ substrate. Therefore, the epitaxial layer 52 (p layer) of the memory cell section 5 in which soft error particularly becomes a problem has a greater thickness than that of the epitaxial layer 56 (p layer) of the logic section 6. In the logic section 6 in which latch up particularly becomes a problem, the thicknesses of the substrate single crystal 51 and the epitaxial layer 55 are made greater to suppress an ohmic voltage drop in the substrate of the semiconductor integrated circuit in order to increase the latch up resistance. In the input-output section 8 in which ESD particularly becomes a problem, furthermore, a thickness of the epitaxial layer 53 (p layer) having a high resistance is increased to enhance the ESD immunity.

By adopting the above-mentioned structure into the substrate of the semiconductor integrated circuit, it is possible to form an integrated circuit having great resistances to all the soft error, the latch up and the ESD.

While the p on, $p^+$ structure has been used for the memory cell section 5 and the logic section 6 shown in FIGS. 16 to 21, the same effects can be obtained by using the p on p$^{++}$ structure. Furthermore, the same effects can be obtained by using the p on p$^-$ structure.

It is also possible to combine the structure according to the fourth embodiment with any of the structures according to the first to third embodiments.

Any of the substrates of the semiconductor integrated circuits according to the first to fourth embodiments may have a structure in which the p$^+$ substrate single crystal (semiconductor substrate layer) in the p on p$^+$ structure is doped with gold.

Figure 22:
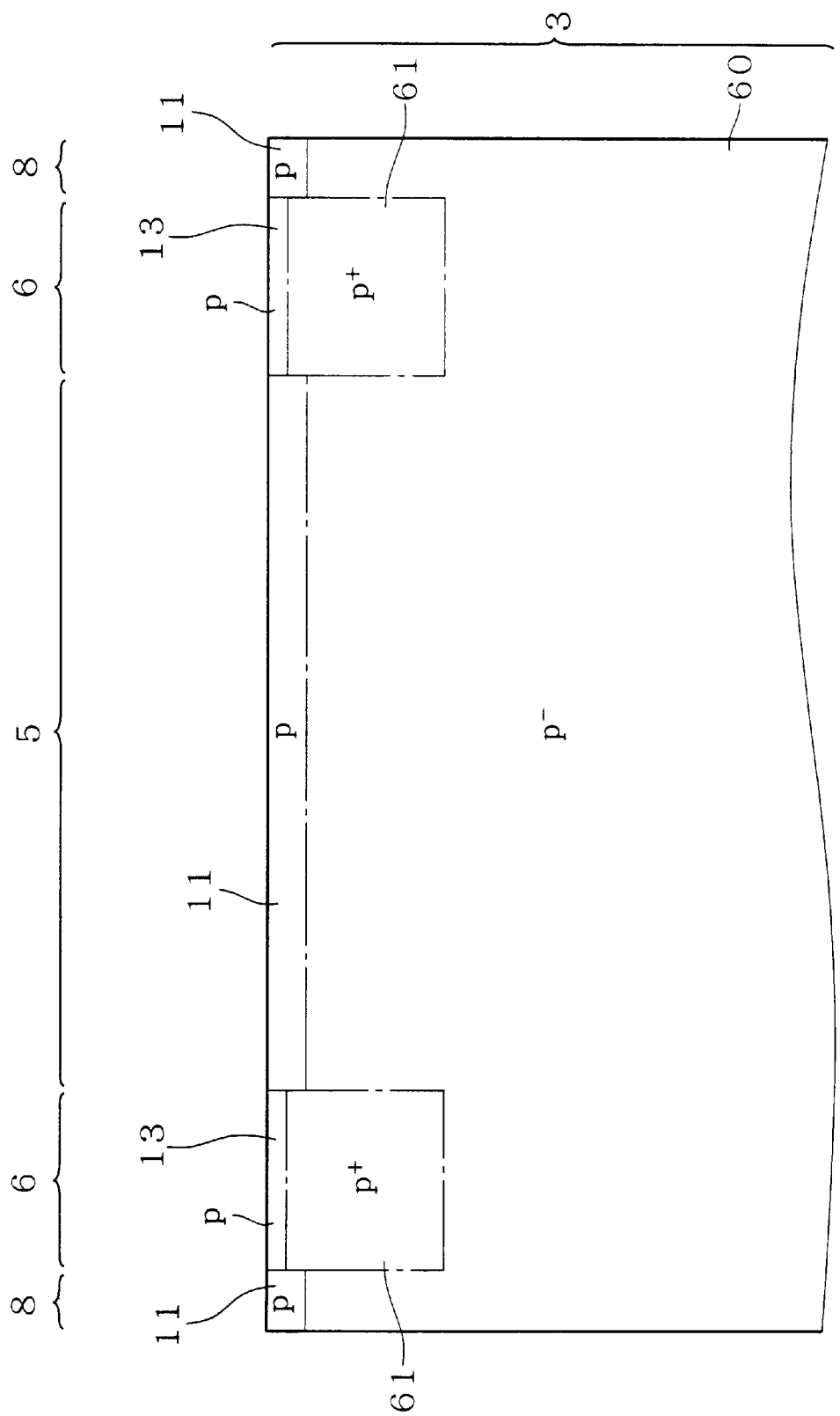
FIG. 22 is a typical view showing an example of a sectional structure of the substrate of the semiconductor integrated circuit.
Figure 23:
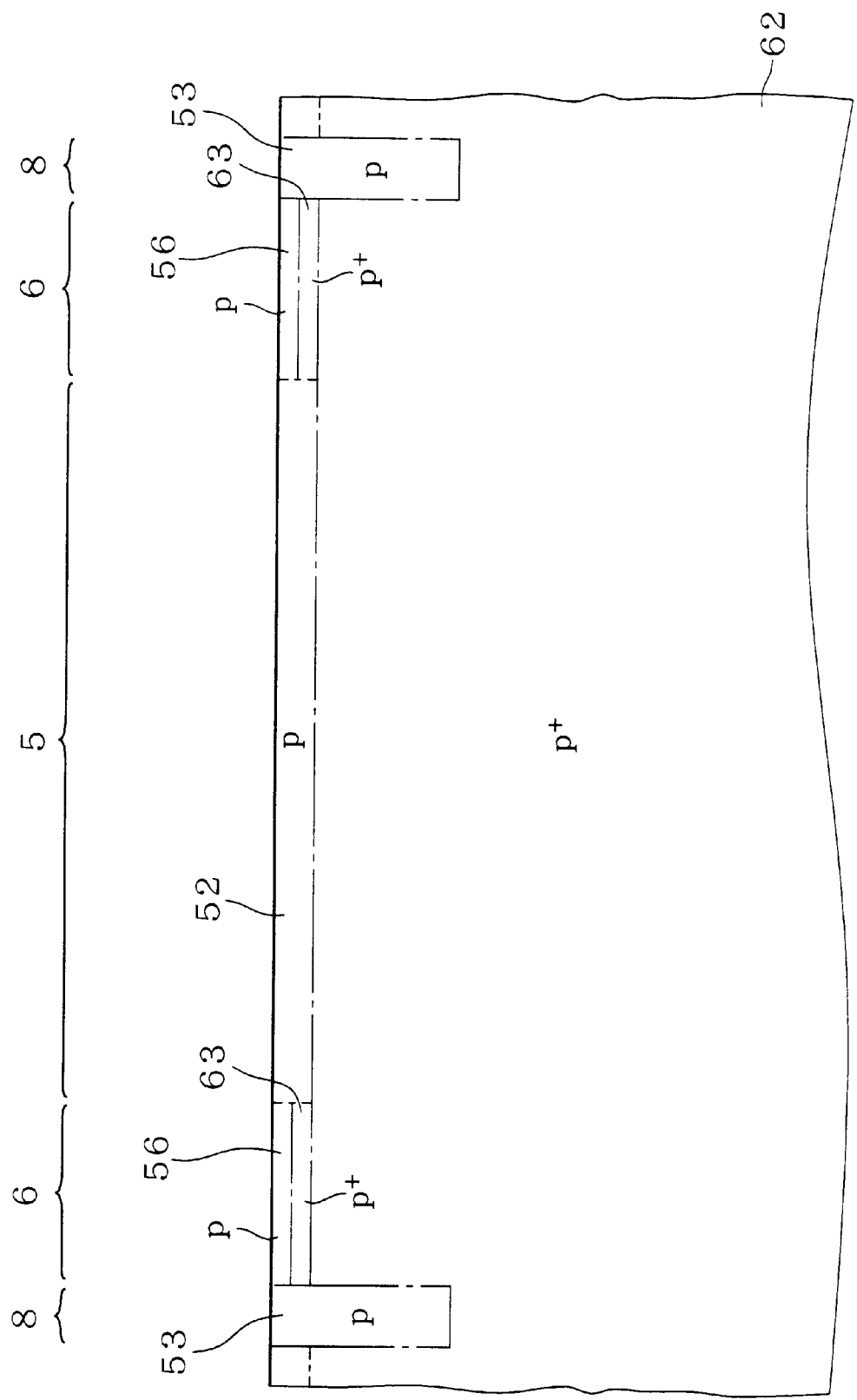
FIG. 23 is a typical view showing another example of the sectional structure of the substrate of the semiconductor integrated circuit.

FIGS. 22 and 23 are typical views showing examples of the sectional structure of the substrate of the semiconductor integrated circuit. In FIG. 22, a substrate single crystal 60 serving as a semiconductor substrate layer corresponds to the substrate single crystal 10 shown in FIG. 2, and an epitaxial layer 61 which is equivalent to the semiconductor substrate layer corresponds to the epitaxial layer 12 shown in FIG. 2. The same reference numerals as in FIG. 2 denote the same portions as in FIG. 2.

In FIG. 23, a substrate single crystal 62 serving as a semiconductor substrate layer corresponds to the substrate single crystal 51 shown in FIG. 21, and an epitaxial layer 63 serving as the semiconductor substrate layer corresponds to the epitaxial layer 55 shown in FIG. 21. The same reference numerals as in FIG. 21 denote the same portions as in FIG. 21. The substrate single crystals 60 and 62 are different from the substrate single crystals 10 and 51 and the epitaxial layer 63 is different from the epitaxial layer 55 in that they are doped with gold or not.

For example, if the substrate single crystal 62 is formed of silicon as a main material and is doped with the gold, a level is made in the vicinity of the center of a forbidden band. The level acts as a trapping level for carriers. If a concentration of the gold is increased, a lifetime of the minority carriers in the substrate single crystals 60 (p$^-$ layer) and 62 (p$^+$ layer) is remarkably decreased as compared with the case where the silicon is not doped with the gold. Therefore, if the silicon is doped with the gold, the soft error immunity is further increased.

Also in the case where a part of the semiconductor surface layer of the epitaxial wafer is doped with the gold, the same effects can be obtained.

Figure 24:
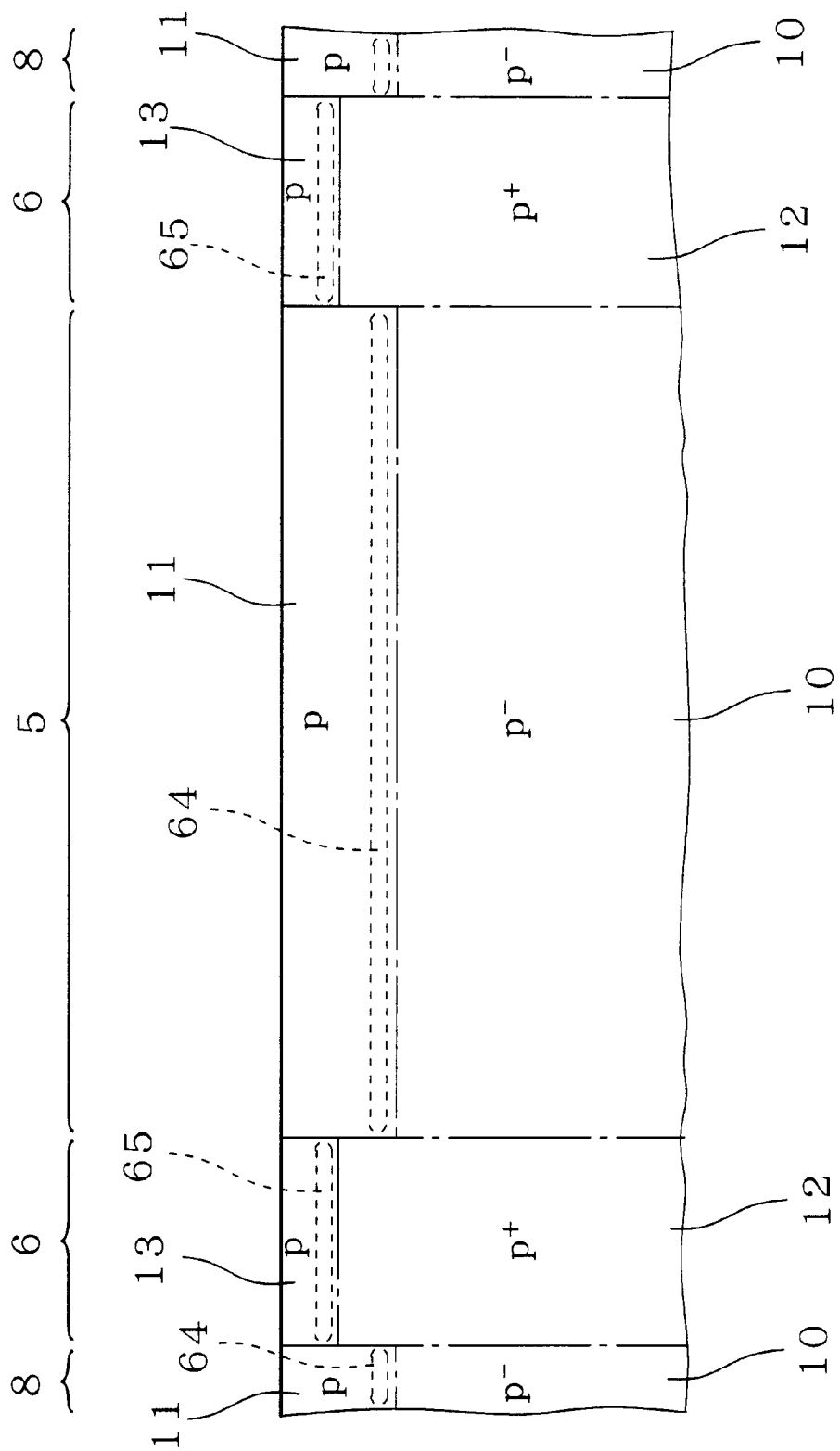
FIG. 24 is a typical view showing yet another example of the sectional structure of the substrate of the semiconductor integrated circuit.
Figure 25:
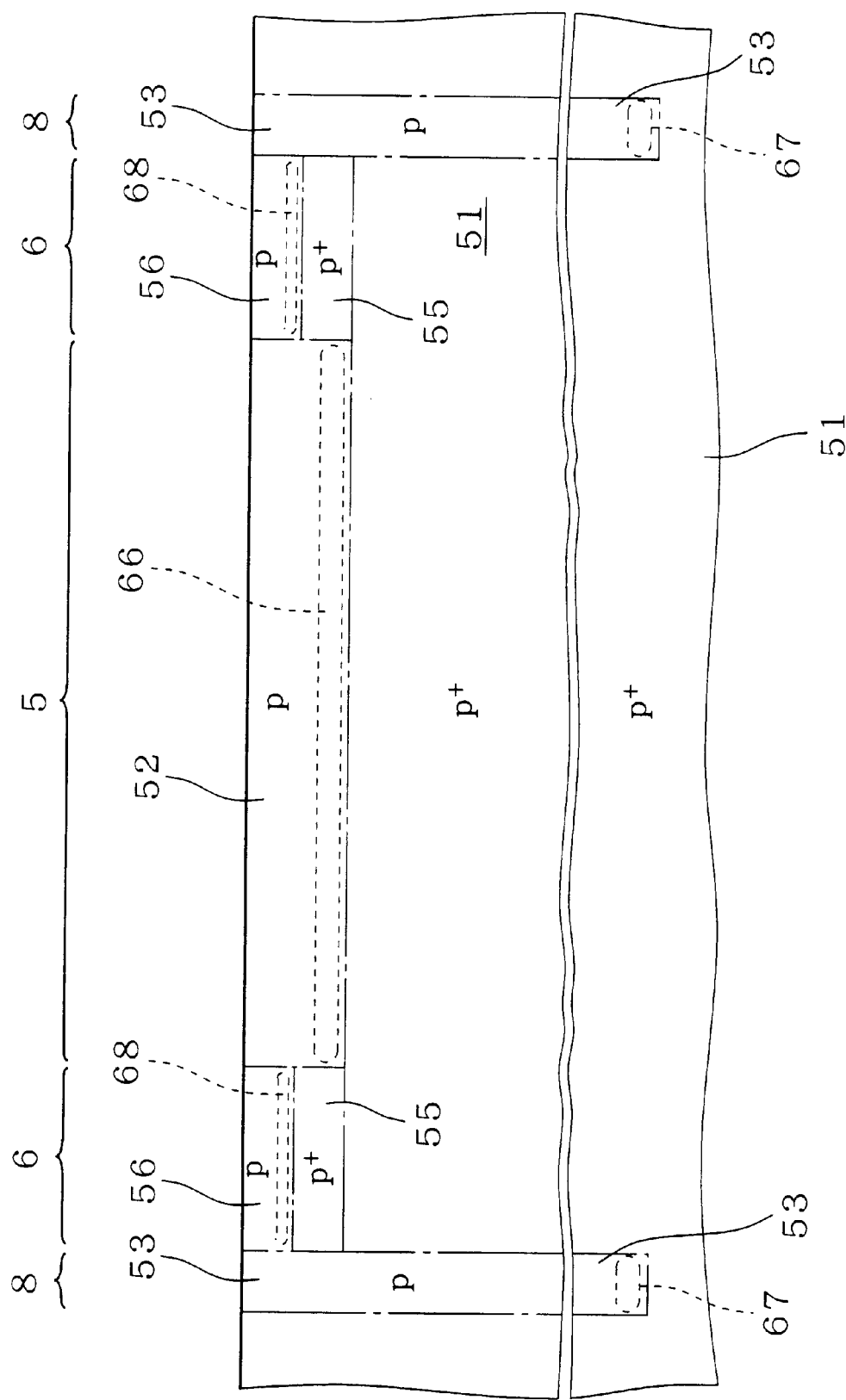
FIG. 25 is a typical view showing a further example of the sectional structure of the substrate of the semiconductor integrated circuit.

FIGS. 24 and 25 are typical views showing other sectional structures of the substrate of the semiconductor integrated circuit. In FIGS. 24 and 25, the reference numerals 64 to 68 denote regions where a semiconductor surface layer is doped with gold. The same reference numerals as in FIG. 2 or 21 denote the same portions as in FIG. 2 or 21 Even if the regions 64 to 68 which are a part of the semiconductor surface layer are doped with the gold, a lifetime in the regions 64 to 68 (p layers) is remarkably decreased. Consequently, the soft error immunity is increased.

Also in the case where a metal other than the gold, for example, a heavy metal such as silver, copper or platinum is used, the same effects can be obtained.

Next, description will be given to a method for using a substrate to form an integrated circuit having a layer doped with gold in a buried n layer or around the buried n layer.

Figure 26:
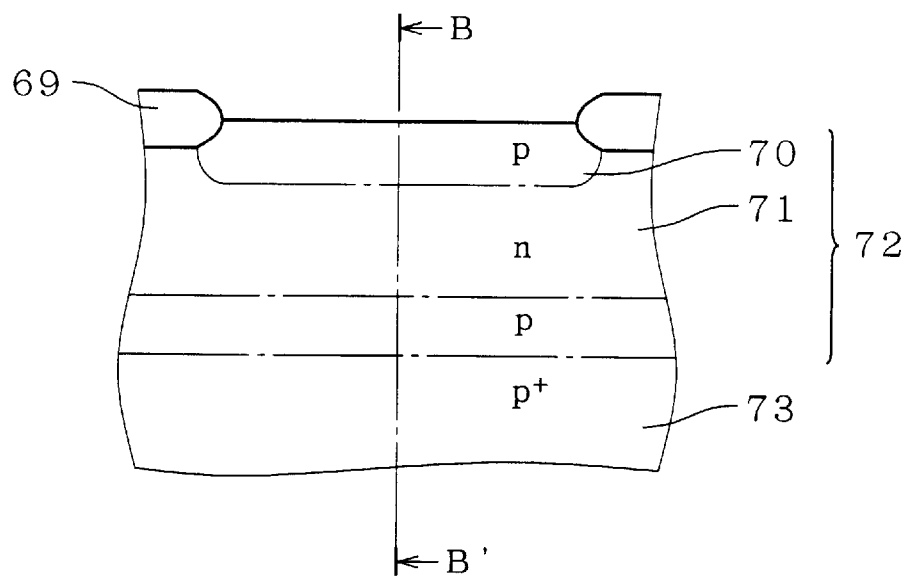
FIG. 26 is a typical view for explaining the sectional structure of the integrated circuit.

FIG. 26 is a typical view for explaining a sectional structure of an integrated circuit. A lot of elements are formed on a surface of the substrate of the semiconductor integrated circuit. Therefore, the elements are isolated by an isolation film 69. A p well 70 having a high impurity concentration is formed on an opening of the isolation film 69. A buried n layer 71 doped with gold is formed under the p well 70. The buried n layer 71 is formed in an epitaxial layer 72. The epitaxial layer 72 is formed on a substrate single crystal 73 (p$^+$ layer) by epitaxial growth.

The epitaxial layer 72 and the substrate single crystal 73 form a semiconductor substrate. All the isolation film 69, the p well 70 and the buried n layer 71 doped with the gold are formed on a surface and inside of the epitaxial layer 72.

Figure 27:
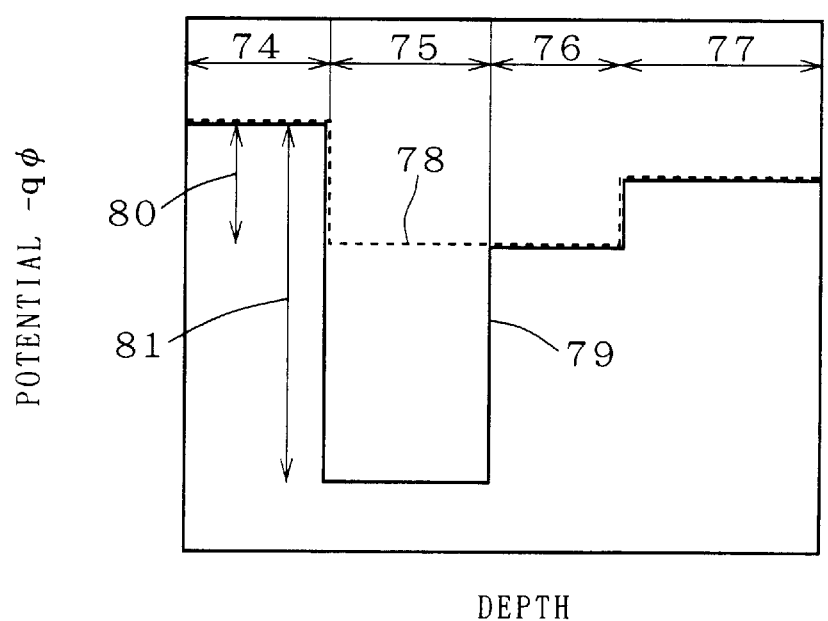
FIG. 27 is a graph showing a potential in a direction of a depth on a section taken along the line B–B' of the substrate of the semiconductor integrated circuit in FIG. 26.

FIG. 27 is a graph showing a potential in a direction of a depth for a section of the substrate of the semiconductor integrated circuit taken along the line B-B' in FIG. 26. In the graph, a dotted line 78 indicates a potential obtained when no buried n layer is formed, and a solid line 79 indicates a potential obtained when the buried n layer is formed. A range shown by an arrow 74 corresponds to the p well 70, a range shown by an arrow 75 corresponds to a position in which the buried n layer 71 is formed, a range shown by an arrow 76 corresponds to a position in which the p well 70 and the buried n layer 71 of the epitaxial layer 72 are not formed, and a range shown by an arrow 77 corresponds to the substrate single crystal 73 which is a semiconductor substrate layer. A width of an arrow 80 indicates a height of the potential obtained when no buried n layer is formed, and a width of an arrow 81 indicates a height of the potential obtained when the buried n layer is formed.

When α-particles are injected into the semiconductor substrate, electron-hole pairs are generated. If the buried n layer exists, the buried n layer 71 has a potential well to the electrons. For this reason, the height 81 of an effective potential is greater than the height 80 of the potential obtained when no buried n layer is formed. Therefore, the soft error immunity is increased when the buried n layer 71 is formed. According to the present invention, the buried n layer 71 is doped with gold. Consequently, the carriers are trapped because of a trapping center in the buried n layer 71. Therefore, the soft error immunity is increased more than in the case where the buried n layer 71 is not doped with the gold.

A combination of the substrate single crystal 73 and the epitaxial layer 72 corresponds to that of the substrate single crystals 10, 21, 201 and 211 (semiconductor substrate layers) and the epitaxial layers 11, 22, 203 and 213 (semiconductor surface layers), that of the epitaxial layers 12, 27, 202 and 212 (semiconductor substrate layers) and the semiconductor surface layers 13, 28, 203 and 213 (semiconductor surface layers), that of the substrate single crystal 51 (semiconductor substrate layer) and the epitaxial layer 52 (semiconductor surface layer), and that of the epitaxial layer 55 (semiconductor substrate layer) and the epitaxial layer 56 (semiconductor surface layer) in the first to fourth embodiments.

Also in the case where a heavy metal other than gold, for example, silver or copper is used, the same effects can be obtained.

While the case where the buried n layer 71 is doped with the gold has been described above, a p layer having the regions 64 to 68 doped with the gold shown in FIGS. 24 and 25 may be provided in contact with a lower portion of the buried n layer which is not doped with the gold. The regions 64 to 68 doped with the gold do not need to reach the substrate single crystals 10 and 51 provided under the epitaxial layers 11 and 53 (semiconductor surface layers) and the epitaxial layers 12 and 55 (semiconductor substrate layers). The p-type epitaxial layer including the regions doped with the gold is provided under the buried n layer so that the soft error immunity generated by the α-particles having a higher energy is increased in the same manner as in the case where the buried n layer is doped with the gold.

While all the three epitaxial layers 52, 53 and 56 have been the p layers in the fourth embodiment, they may be the p layers having different impurity concentrations or the same impurity concentration. In an case, the same effects as in the above-mentioned embodiments can be obtained.

Fifth Embodiment

A substrate of a semiconductor integrated circuit according to a fifth embodiment is a p on p$^+$ substrate, a p on p$^{++}$ substrate or a p on p$^-$ substrate, and has a structure in which a well is formed in a semiconductor surface layer. The well refers to an impurity region formed in part of a semiconductor substrate. The well is used to form elements having different conductivity types in the same semiconductor substrate. A well is formed in another well, and in this case, the outer well and the inner well have different conductivity types. The well is an impurity region entirely formed in an element-formation region including an active region where elements such as transistor electrodes are formed, extending from a surface of a semiconductor substrate in a direction of depth thereof. Therefore, there are two methods for forming a well: (1) an ion injection at low energy and thermal diffusion at high temperature for long time; and (2) an ion injection at high energy and thermal diffusion at low temperature for short time. A well formed by the method (1) is termed a thermal-diffusion well and that formed by the method (2) is termed a retrograde well, and the following discussion will be presented on a case where the substrate of the semiconductor integrated circuit of the fifth embodiment includes a retrograde well.

Figure 28:
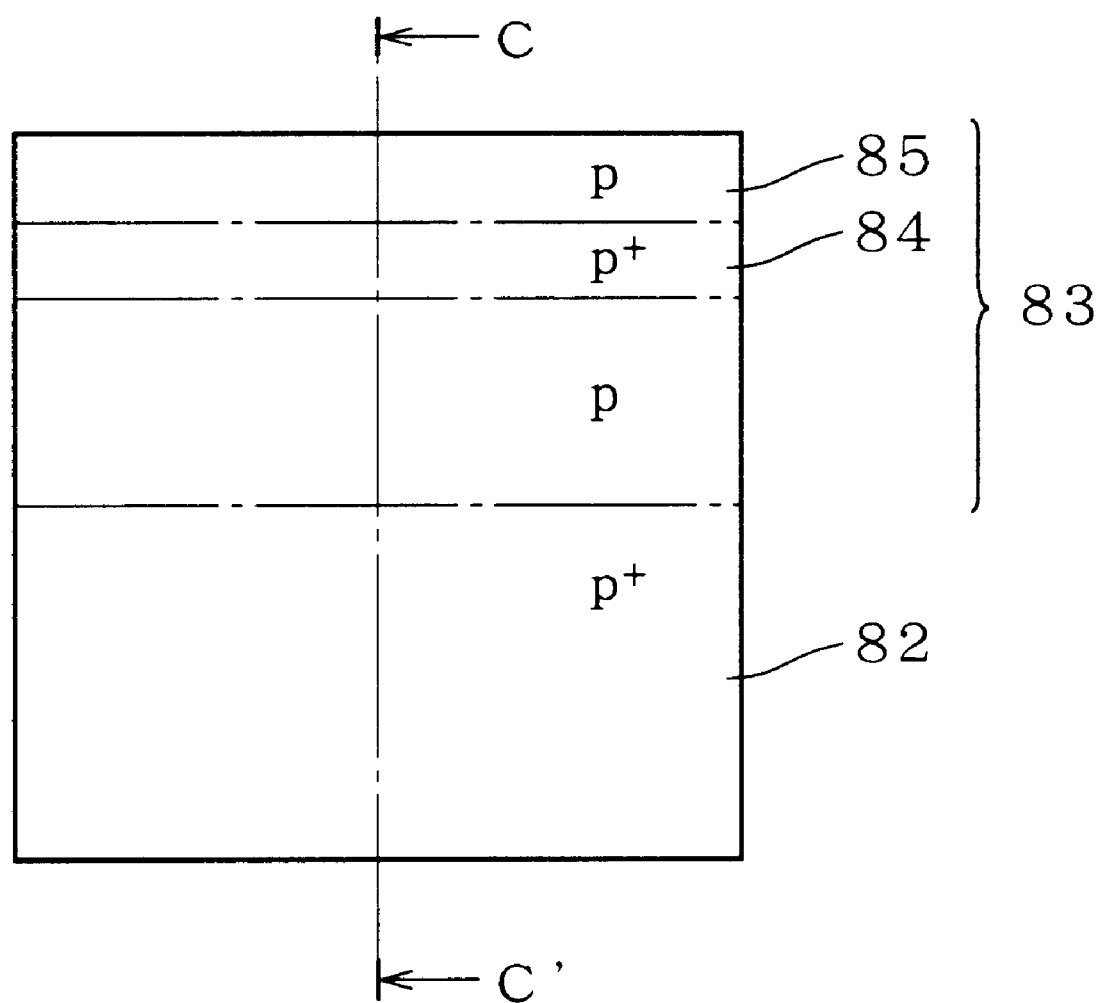
FIG. 28 is a typical view showing an example of a sectional structure of a substrate of a semiconductor integrated circuit according to a fifth embodiment.

FIG. 28 is a typical view showing an example of a sectional structure of the substrate of the semiconductor integrated circuit according to the fifth embodiment. A retrograde well 84 is formed in an epitaxial layer 83 which is a p-type semiconductor surface layer provided on a substrate single crystal 82 that is a p$^+$-type semiconductor substrate layer. Furthermore, a channel cut layer 85 is formed in the vicinity of a surface of the epitaxial layer 83. The channel cut (channel stop) layer means a layer for preventing an inversion layer which causes a surface leak current from being unexpectedly generated on an insulator-semiconductor interface very often. If a layer having a conductivity type reverse to that of the inversion layer and a high impurity concentration is provided on a surface of a substrate end, the inversion layer is not generated so that the surface leak current can be suppressed. The retrograde well is formed by one of island steps, that is, a method for causing ions to enter an inside of the substrate with a high energy.

Figure 29:
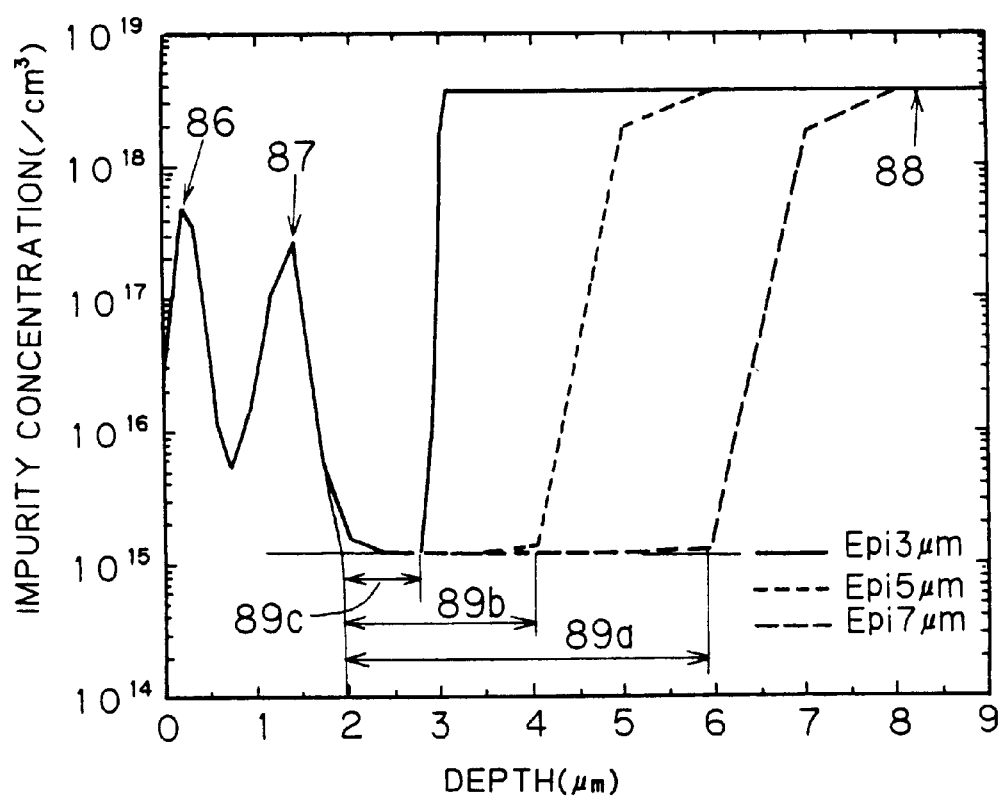
FIG. 29 is a graph showing a boron distribution in a direction of a depth of the substrate of the semiconductor integrated circuit used for a simulation.
Figure 30:
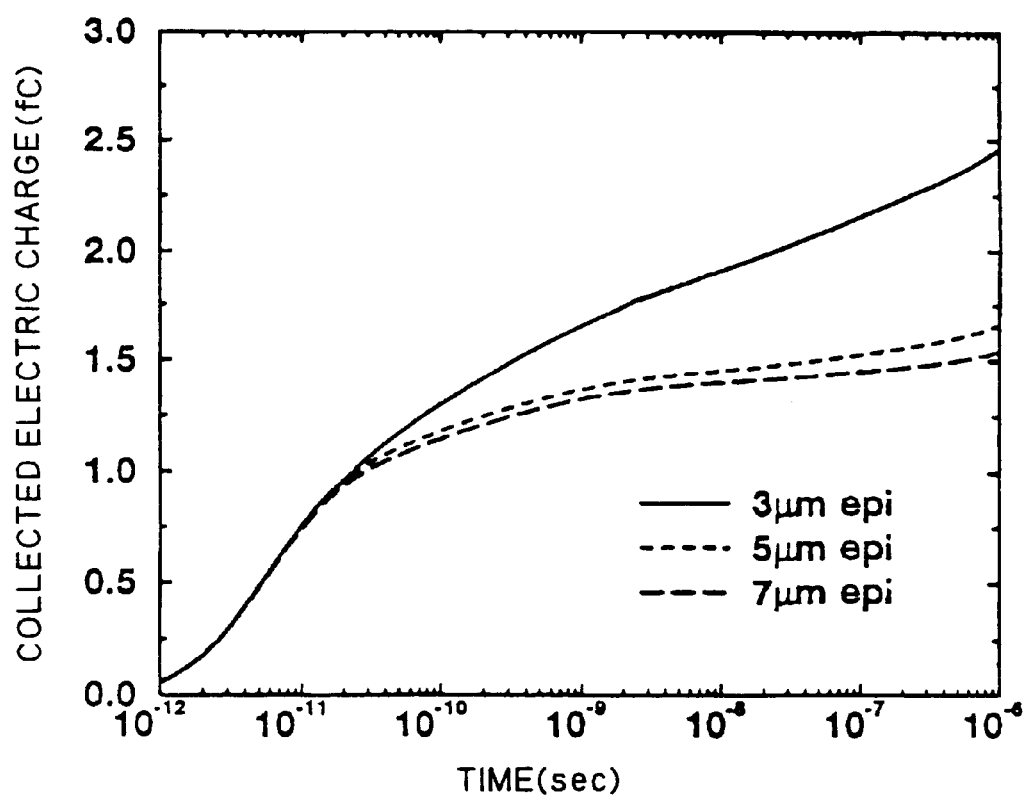
FIG. 30 is a graph showing a simulation result of time dependency of a collected electric charge in the structure of FIG. 28.

FIG. 30 shows a simulation result of electric charge collection obtained when a thickness of the epitaxial layer 83 acting as the semiconductor surface layer is fixed and a length of a region between the substrate single crystal 82 and the retrograde well 84 is varied with the structure shown in FIG. 28. FIG. 29 shows a boron distribution in a direction of a depth of the substrate of the semiconductor integrated circuit used for a simulation. In FIG. 29, a peak of a concentration shown by an arrow 86 is a concentration distribution with formation of the channel cut layer 85, a peak of a concentration shown bay an arrow 87 is a concentration distribution with formation of the retrograde well 84, and a portion having a concentration shown by an arrow 88 corresponds to the substrate single crystal 82.

By varying the thickness of the epitaxial layer 83 (semiconductor surface layer), thicknesses of regions 89a to 89c having low impurity concentrations are set to about 4 $\mu$m, 2 $\mu$m and 1 $\mu$m to perform the simulation. It is assumed that each of the thicknesses of the regions 89a to 89c having the lowest impurity concentration in the epitaxial layer 83 is given at an interval of an intersection of an extended line of the greatest concentration gradient and the lowest concentration on a logarithmic graph in which an impurity concentration is taken as a logarithm.

FIG. 30 shows a result obtained when a quarter of $\alpha$-particle is injected. Consequently, a collected electric charge obtained when one $\alpha$-particle is injected is four times as much as that in the case where a quarter of $\alpha$-particle is injected. After $10^{-6}$ second, the collected electric charge is 6.0 fC if a thickness of a region having a low impurity concentration is about 4 $\mu$m, is about 6.4 fC if the thickness is about 2 $\mu$m, and is about 9.4 fC if the thickness is about 1 $\mu$m. Consequently, it is apparent that the collected electric charge is increased if the thicknesses of the regions 89a to 89c having the lowest impurity concentration in the semiconductor surface layer are reduced.

By utilizing the fact that the collected electric charge is increased if the thickness is reduced, it is attempted that a soft error resistance of a storage capacitor of a DRAM can be enhanced when forming the storage capacitor of the DRAM on the substrate of the semiconductor integrated circuit having the structure shown in FIG. 28. In order to obtain actual effects on enhancement in the soft error resistance, it is an object to provide a substrate of a semiconductor integrated circuit in which soft error is not caused even if one $\alpha$-particle is injected into the storage capacitor formed on the substrate of the semiconductor integrated circuit and capable of storing electric charges of 18 fC to 20 fC.

When half of the electric charges stored in the storage capacitor, that is, electric charges of 9 to 10 fC enter the storage capacitor from the outside, bit error is caused. In consideration of a time for which the collected electric charge is saturated, it is preferable that the collected electric charge should be smaller than 9 to 10 fC after $10^{-6}$ second.

In the case where the thickness of the epitaxial layer 83 (semiconductor surface layer) is 3 $\mu$m, it is expected that the collected electric charge is greater than 9 to 10 fC because it has not been saturated as shown in FIG. 30. Accordingly, a region having the lowest impurity concentration in the epitaxial layer 83 should not have a thickness of about 1 $\mu$m but about 2 $\mu$m or more in order to obtain a desired soft error resistance. By setting the thickness of the region having the lowest impurity concentration: in the epitaxial layer 83 to 2 $\mu$m it is hard to cause soft error for the capacitor having the stored electric charges of 18 fC or less.

An investigation will be made into a difference in the collected electric charge caused by a difference in an interval between the retrograde well 84 and the substrate single crystal 82 (semiconductor substrate layer). It is supposed that the quantity of the electrons confined between the retrograde well 84 and the substrate single crystal 82 is almost equal irrespective of the difference in the interval. However, if the difference in the interval is smaller, a peak value of a concentration of the minority carriers which are confined is increased. Furthermore, if the difference in the interval is smaller, a depth where a peak appears on the concentration of the minority carriers is reduced. Consequently, a concentration gradient of the minority carriers confined in the retrograde well 84 is increased so that the collected electric charge is increased.

Figure 31:
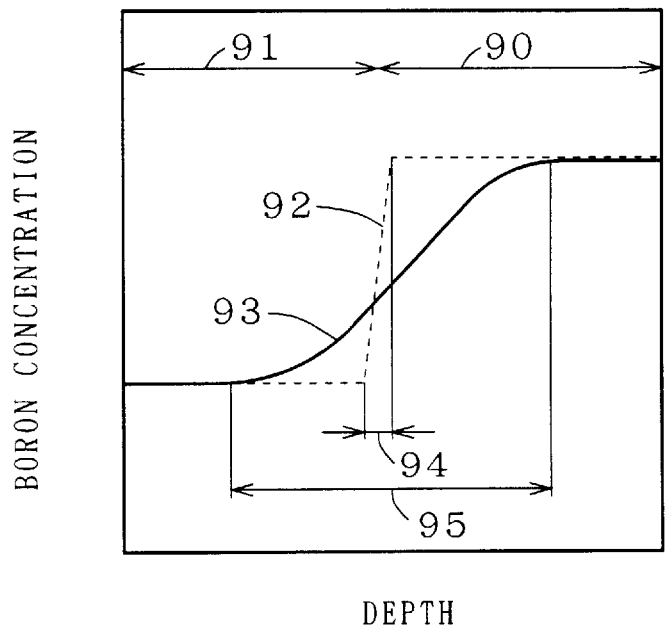
FIG. 31 is a graph showing a relationship between a boron concentration and a depth on a boundary between a semiconductor substrate layer and a semiconductor surface layer.

FIG. 31 is a graph for explaining that the region having the lowest impurity concentration is reduced by heat treatment. FIG. 31 shows a relationship between a boron concentration and a depth on a boundary between the substrate single crystal 82 and the epitaxial layer 83. A region shown by an arrow 90 on the graph corresponds to the substrate single crystal 82, and a region shown by an arrow 91 on the graph corresponds to the epitaxial layer 83. A dotted line 92 indicates a distribution of the boron concentration obtained before the heat treatment, and a solid line 93 indicates the distribution of the boron concentration obtained after the heat treatment A region shown by an arrow 94 denotes a boron concentration changing region obtained before the heat treatment, and a region shown bay an arrow 95 denotes the boron concentration changing region obtained after the heat treatment. The distribution of the boron concentration is measured by the SIMS (Secondary Ion Mass Spectrometry) method.

If a heat treatment temperature is low when forming the semiconductor integrated circuit on a surface of the epitaxial layer 83 (semiconductor surface layer), a thickness of the boron concentration changing region is seldom changed. However, in the case where LOCOS is used when manufacturing the semiconductor integrated circuit, a substrate has a temperature of 900° C. or more for a long period of time. Therefore, boron is diffused after the semiconductor integrated circuit is formed so that the distribution of the boron concentration becomes smooth. Consequently, there is a high possibility that the interval between the retrograde well 84 and the substrate single crystal 82 (semiconductor substrate layer) might be changed to 2 $\mu$m or less after the semiconductor integrated circuit is formed even if the interval is preset to 2 $\mu$m or more.

Accordingly, in the case where the thickness of the region having the lowest impurity concentration is reduced by the heat treatment, it is desirable that the thickness should be preset greater in anticipation of diffusion of an impurity.

When the thickness of the region having the lowest impurity concentration cannot be preset greater, that is, the interval between the retrograde well 84 and the substrate single crystal 82 on the substrate of the semiconductor integrated circuit approximates 2 $\mu$m, a method in which the substrate of the semiconductor integrated circuit does not need to have a high temperature, for example, STI (Shallow Trench Isolation) is used for an isolation in place of the LOCOS. During STI formation, a trench is filled with an oxide film such as TEOS (tetraethyl orthosilicate) or the like at a temperature of about 800° C. Consequently, thermal diffusion of the impurity can be suppressed more than in the LOCOS formation. Thus, it is possible to suppress a reduction in a length of the region having the lowest impurity concentration in the semiconductor surface layer (epitaxial layer 83).

Figure 32:
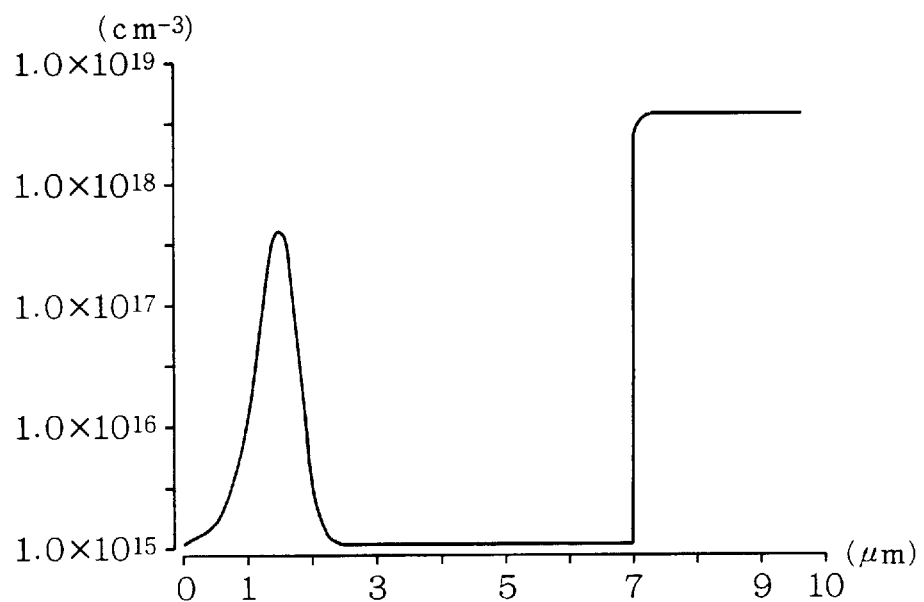
FIG. 32 is a graph showing a boron concentration distribution immediately after an ion injection for formation of a retrograde well.
Figure 33:
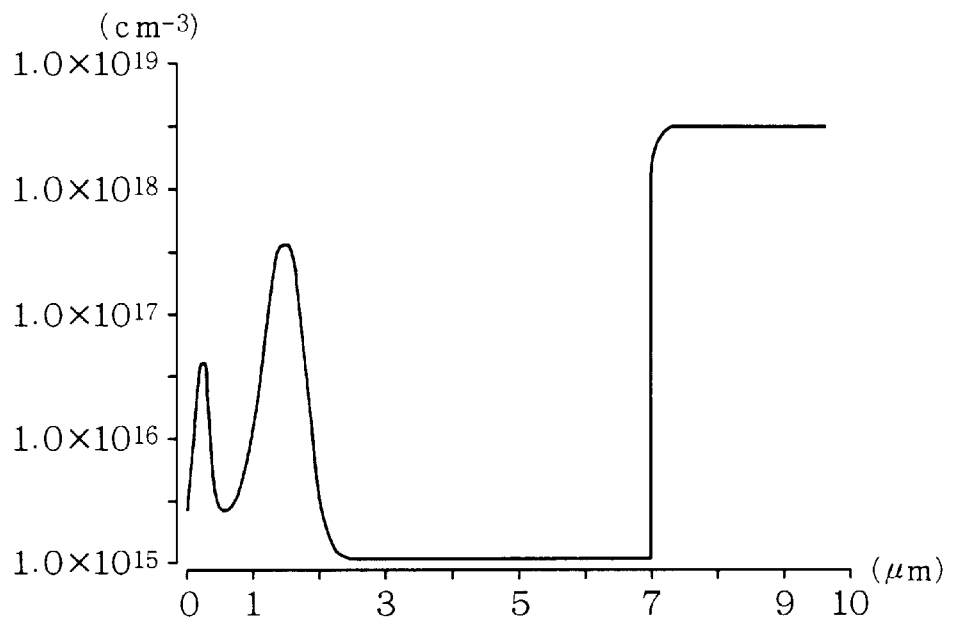
FIG. 33 is a graph showing a boron concentration distribution immediately after an ion injection for formation of a channel cut layer from the state of FIG. 32.
Figure 34:
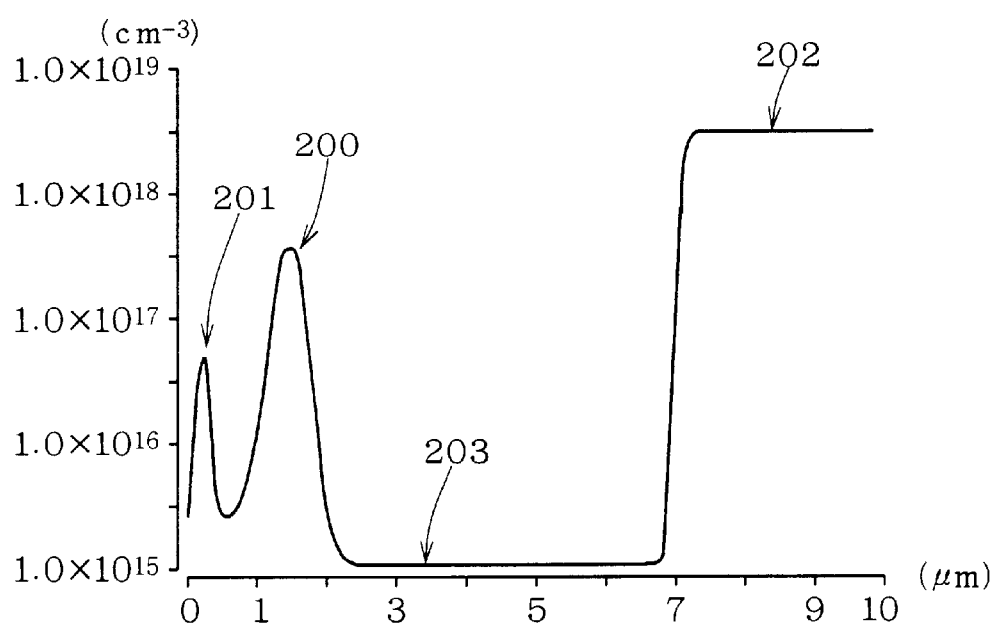
FIG. 34 is a graph showing a boron concentration distribution immediately after thermal diffusion from the state of FIG. 33.

Next, a case where the substrate of the semiconductor integrated circuit of the fifth embodiment includes a thermal-diffusion well will be studied, as compared with the case where it includes the retrograde well. In general, the retrograde well has the same conductivity type as the channel cut layer. An impurity concentration of the retrograde well monotonously increases, in general, as the depth goes from the surface of the semiconductor substrate to a depth where the impurity concentration reaches a peak. The peak of the impurity concentration of the retrograde well can be distinguished from that of the channel cut layer. The peak of impurity concentration of the channel cut layer is found in a relatively shallow portion at almost the same level as a bottom surface of an isolation oxide film and the peak of impurity concentration of the retrograde well is found in a deeper portion as compared with the channel cut layer. Therefore, the injection energy for forming the retrograde well is higher than that for forming the channel cut layer, and, for example, if the injection energy for channel cut layer is 100 keV, that for the retrograde well is more than 100 keV. To form the retrograde well in a ULSI, an ion injection is performed with boron at, e.g., a dose of about $1.0\times10^{13}$ cm$^{-2}$ at an energy of 800 keV. The thermal diffusion after the injection is performed at the temperature of 800° C. for 60 minutes, for example. Since the heat treatment for forming the retrograde well is performed at low temperature for short time, the impurity concentration distribution at the ion injection remains to some degree and the impurity concentration distribution having the peak can be checked by a measurement using SIMS (secondary ion mass spectrometry) and the like. FIG. 32 is a graph showing a concentration distribution immediately after the ion injection with boron at a dose of about $1.0\times10^{13}$ cm$^{-2}$ at an energy of 800 keV. FIG. 33 is a graph showing a concentration distribution immediately after the ion injection for forming the channel cut layer from the state of FIG. 32. FIG. 34 is a graph showing a concentration distribution immediately after the thermal diffusion at the temperature of 800° C. for 60 minutes from the state of FIG. 33. The ion injection for forming the channel cut layer of FIG. 33 is performed with boron at, e.g., a dose of about $10\times10^{12}$ cm$^{-2}$ at an energy of 100 keV. Since the heat treatment is performed at low temperature for short time, the boron concentration distribution hardly changes through the heat treatment, as is clear from comparison between FIGS. 33 and 34. In FIG. 34, between a peak 200 of the impurity concentration of the retrograde well which is found in a portion deeper than a peak 201 of the impurity concentration of the channel cut layer and a peak 202 of impurity concentration of the substrate single crystal found is a region of the lowest impurity concentration indicated by an arrow 203. The region 203 exists in a semiconductor surface layer (epitaxial layer), and in this case, has a thickness of 2 $\mu$m or more as can be seen from FIG. 34.

Figure 35:
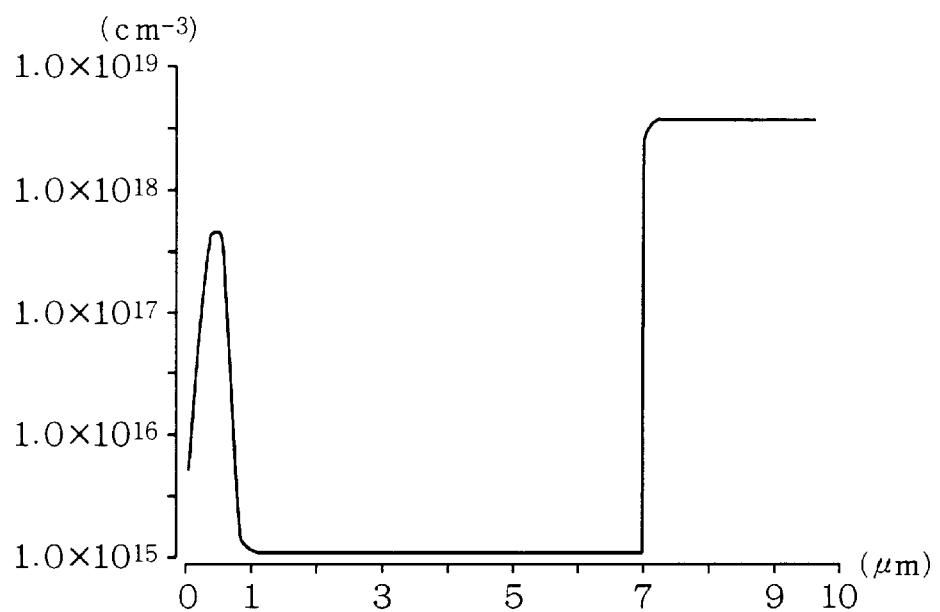
FIG. 35 is a graph showing a boron concentration distribution immediately after an ion injection for formation of a thermal-diffusion well.
Figure 36:
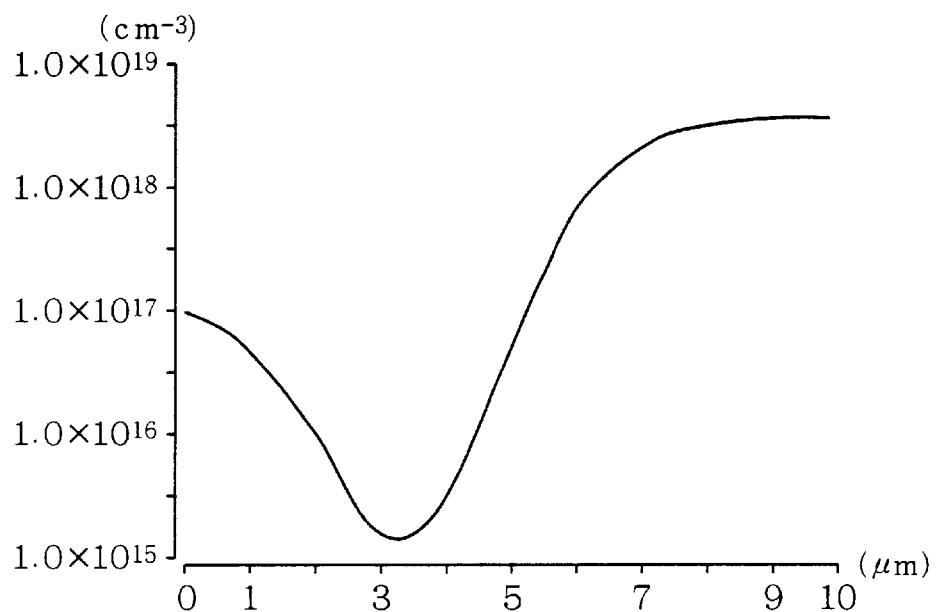
FIG. 36 is a graph showing a boron concentration distribution immediately after thermal diffusion from the state of FIG. 35.
Figure 37:
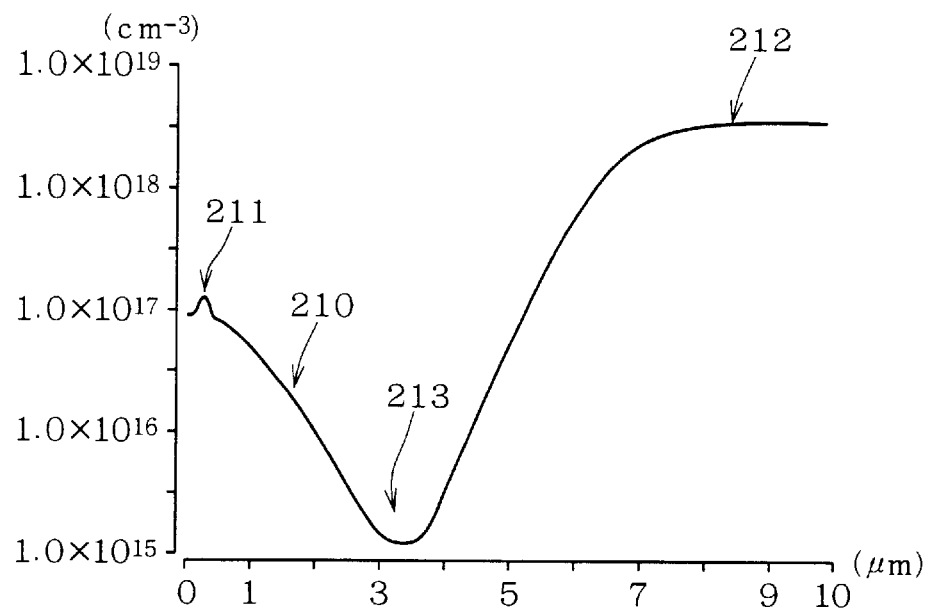
FIG. 37 is a graph showing a boron concentration distribution immediately after an ion injection for formation of a channel cut layer from the state of FIG. 36.
Figure 38:
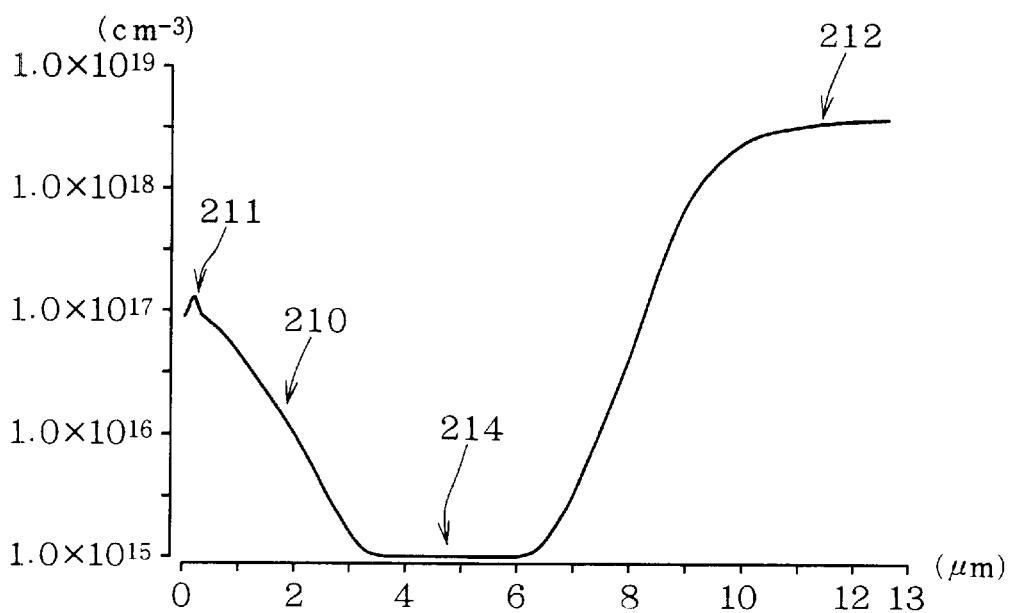
FIG. 38 is a graph showing a boron concentration distribution of a thermal-diffusion well in a case where an epitaxial layer thicker than an epitaxial layer of FIG. 37 is used.
Figure 39:
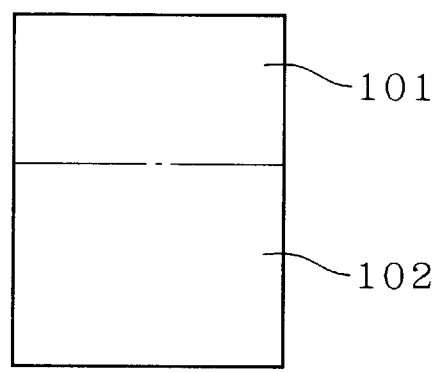
FIG. 39 is a typical diagram showing a sectional structure of a p on p$^-$ substrate, a p on p$^+$ substrate or a p on p$^{++}$ substrate according to the prior art.

Subsequently, how the impurity concentration which is the lowest in the semiconductor surface layer (epitaxial layer) changes through the thermal diffusion in the thermal-diffusion well will be studied. Since formation of the thermal-diffusion well requires a treatment of the semiconductor substrate at high temperature for long time after ion injection, the impurity concentration distribution is more gentle than that immediately after the ion injection. Therefore, the thermal-diffusion well has an almost uniform impurity concentration distribution from the surface of the semiconductor substrate to a predetermined depth. The ion injection for forming the thermal-diffusion well is performed with boron at, e.g., a close of about $1.0\times10^{13}$ cm$^{-2}$ at an energy of 100 keV. The heat treatment for forming the thermal-diffusion well is performed at the temperature of 1100° C. for 420 minutes. FIGS. 35 to 37 show a simulated boron concentration distributions in forming a thermal-diffusion well in a p on p$^+$ epitaxial wafer having an epitaxial layer of 7 $\mu$m. FIG. 35 is a graph showing a boron concentration distribution immediately after the ion injection. FIG. 36 is a graph showing a boron concentration distribution after heat treatment at the temperature of 1100° C. for 420 minutes from the state of FIG. 35. FIG. 37 is a graph showing a boron concentration distribution after the ion injection for forming the channel cut layer from the state of FIG. 36. The ion injection for forming the channel cut layer is performed with boron at, e.g., a dose of about $1.0\times10^{12}$ cm$^{-2}$ at an energy of 100 keV. As is seen from FIG. 37, an impurity: concentration distribution 210 of the thermal-diffusion well has no peak and the impurity concentration decreases towards a deeper portion in the semiconductor substrate. A peak 211 of the impurity concentration of the channel cut layer is found in a relatively shallow portion of the surface of the semiconductor substrate. A region of the lowest concentration in the epitaxial layer indicated by an arrow 213 has a thickness of less than 2 μm. The thickness of the region of the lowest concentration is defined in the same manner as in the above retrograde well. Since the impurity concentration distribution 210 of the thermal-diffusion well becomes gentle through the heat treatment and an impurity of the substrate single crystal moves towards the epitaxial layer to give an impurity concentration distribution 212 a gentle slope near an interface between the substrate single crystal and the epitaxial layer, the region of the lowest concentration becomes thinner. In order to ensure a region of the lowest concentration having a thickness of 2 μm or more as shown in FIG. 38 when the thermal-diffusion well is formed under the same condition, the epitaxial layer must have a thickness of 10 μm or more. As can be seen from comparison between the retrograde well and the thermal-diffusion well, though it is more difficult to provide the region having a thickness of 2 μm or more in the thermal-diffusion well, it is possible if the condition such as a thickness of the epitaxial layer in the epitaxial wafer is appropriately set. Though the p on $p^+$ substrate is used in the above discussion on the substrate of the semiconductor integrated circuit of the fifth embodiment, a p on $p^-$ substrate or a p on $p^{++}$ substrate may be used to achieve the same effect as the fifth embodiment.

While the invention has been described in detail, the foregoing description is in all aspects illustrative and not restrictive. It is understood that numerous other modifications and variations can be devised without departing from the scope of the invention.

We claim:

1. A substrate of a semiconductor integrated circuit comprising:
   a first semiconductor surface layer made of a single crystal having a single orientation and almost uniform first impurity concentration and configured to form a first circuit section including a plurality of semiconductor elements;
   a second semiconductor surface layer made of a single crystal having the same orientation and conductivity type as that of said first semiconductor surface layer, having an almost uniform second impurity concentration, and configured to form a second circuit section including a plurality of semiconductor elements; and
   a semiconductor substrate layer which is made of a substrate single crystal having the same orientation and conductivity type as that of each of said first and second semiconductor surface layers, having an almost uniform third impurity concentration and configured to serve as a formation substrate for each of said first and second semiconductor surface layers, said semiconductor substrate layer having first and second principal planes having different heights from each other,
   wherein a thickness of said semiconductor substrate layer between a bottom face and said first principal plane thereof is larger than a thickness of said semiconductor substrate layer between said bottom face and said second principal plane thereof,
   said first semiconductor surface layer is directly formed on said first principal plane, said second semiconductor surface layer is directly formed on said second principal plane, and said third impurity concentration is higher than each of said first and second impurity concentrations, and
   the first circuit functions as a memory circuit, and the second circuit functions as an input/output circuit.

2. The substrate of a semiconductor integrated circuit according to claim 1, wherein said first semiconductor surface layer is an epitaxial layer of an epitaxial wafer, and said semiconductor substrate layer is a substrate single crystal of said epitaxial wafer.

3. The substrate of a semiconductor integrated circuit according to claim 2, wherein said second principal plane is a bottom face of a trench formed in said epitaxial layer of said epitaxial wafer.

4. The substrate of a semiconductor integrated circuit according to claim 2, wherein said second principal plane is a top face of an epitaxial layer formed on a bottom face of a trench formed in a surface of said epitaxial wafer.

5. The substrate of a semiconductor integrated circuit according to claim 1, further comprising an alignment mark configured to specify places where said first circuit section and said second circuit section are to be formed.

6. The substrate of a semiconductor integrated circuit according to claim 1, wherein a metal is diffused into a region having a predetermined depth from said first or second semiconductor surface layer.

7. A substrate of a semiconductor integrated circuit comprising:
   a first semiconductor surface layer made of a single crystal having a single orientation and a first impurity concentration and configured to form a first circuit section including a plurality of semiconductor elements;
   a second semiconductor surface layer made of a single crystal having the same orientation and conductivity type as that of said first semiconductor surface layer, having a second impurity concentration and configured to form a second circuit section including a plurality of semiconductor elements;
   a first semiconductor substrate layer which is made of a substrate single crystal having the same orientation and conductivity type as that of said first semiconductor surface layer, having a third impurity concentration, and configured to serve as a formation substrate for said first semiconductor surface layer; and
   a second semiconductor substrate layer which is made of a substrate single crystal having the same orientation and conductivity type as that of said second semiconductor surface layer, having a fourth impurity concentration, and configured to serve as a formation substrate for said second semiconductor surface layer,
   wherein said first semiconductor surface layer is directly formed on said first semiconductor substrate layer,
   said second semiconductor surface layer is directly formed on said second semiconductor substrate layer,
   said first impurity concentration is higher than said third impurity concentration,
   said second impurity concentration is lower than said fourth impurity concentration, and
   the first circuit functions as a memory circuit, and the second circuit functions as an input/output circuit.

8. The substrate of a semiconductor integrated circuit according to claim 7, wherein said first semiconductor surface layer is an epitaxial layer of an epitaxial wafer, and said first semiconductor substrate layer is a substrate single crystal of said epitaxial wafer.

9. The substrate of a semiconductor integrated circuit according to claim 8, wherein said second semiconductor substrate layer has a surface which is a bottom face of a trench formed in said epitaxial layer of said epitaxial wafer.

10. The substrate of the semiconductor integrated circuit according to claim 8, wherein said second semiconductor substrate layer has a surface which is a top face of an epitaxial layer formed on a bottom face of a trench formed in said epitaxial layer of said epitaxial wafer.

11. The substrate of a semiconductor integrated circuit according to claim 7, further comprising an alignment mark configured to specify places where said first circuit section and said second circuit section are to be formed.

12. The substrate of a semiconductor integrated circuit according to claim 7, wherein a metal is diffused into a region having a predetermined depth from said first or second semiconductor surface layer.

* * * * *